United States Patent
Kim

(10) Patent No.: US 11,797,382 B2
(45) Date of Patent: Oct. 24, 2023

(54) SEMICONDUCTOR MEMORY DEVICE, SEMICONDUCTOR MEMORY SYSTEM INCLUDING THE SAME, METHOD OF DRIVING THE SEMICONDUCTOR MEMORY SYSTEM

(71) Applicant: SK hynix Inc., Icheon-si (KR)

(72) Inventor: Tae Ho Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/841,044

(22) Filed: Jun. 15, 2022

(65) Prior Publication Data

US 2022/0308961 A1      Sep. 29, 2022

Related U.S. Application Data

(62) Division of application No. 16/874,103, filed on May 14, 2020, now Pat. No. 11,379,302.

(30) Foreign Application Priority Data

Aug. 21, 2019   (KR) .................. 10-2019-0102537

(51) Int. Cl.
*G06F 11/00*   (2006.01)
*G06F 11/10*   (2006.01)
*G11C 13/00*   (2006.01)

(52) U.S. Cl.
CPC ...... *G06F 11/1068* (2013.01); *G11C 13/0026* (2013.01); *G11C 13/0028* (2013.01)

(58) Field of Classification Search
CPC ............ G11C 13/0026; G11C 13/0028; G11C 2029/0411; G11C 29/52; G11C 2029/3602; G11C 29/76; G06F 11/1068
See application file for complete search history.

(56) References Cited

U.S. PATENT DOCUMENTS

| | | | |
|---|---|---|---|
| 7,502,251 B2 | 3/2009 | Choi et al. | |
| 8,724,408 B2* | 5/2014 | Ho | G11C 29/00 365/200 |
| 9,058,857 B2 | 6/2015 | Liu et al. | |
| 9,239,355 B1* | 1/2016 | Burstein | G11C 29/16 |
| 9,514,258 B2* | 12/2016 | Amirkhanyan | G06F 30/398 |

(Continued)

*Primary Examiner* — Esaw T Abraham
(74) *Attorney, Agent, or Firm* — WILLIAM PARK & ASSOCIATES LTD.

(57) ABSTRACT

A semiconductor memory device includes a resistive change memory device including a control circuit block and a plurality of memory decks electrically connected with the control circuit block. The semiconductor memory device includes a pattern generation block, a position correction block and a position decision block. The pattern generation block receives a row address, a column address and a deck selection signal to generate a plurality of pattern generation signals to select a plurality of memory cells in the memory deck in various patterns. The position correction block receives a temporary code for classifying the memory cells into a temporary near cell region and a temporary far cell region and for reflecting a position of the memory deck in the temporary code to output a correction code. The position decision block is configured to generate first to third reset signals to reset a near cell region, a middle cell region and a far cell region based on the pattern generation signals and the correction code.

14 Claims, 25 Drawing Sheets

(56) References Cited

U.S. PATENT DOCUMENTS

| | | | |
|---|---|---|---|
| 9,665,677 B2 * | 5/2017 | Subramanian | G06F 30/34 |
| 10,002,045 B2 * | 6/2018 | Chung | G11C 7/20 |
| 10,490,270 B2 | 11/2019 | Ignowski et al. | |
| 10,573,356 B2 * | 2/2020 | Cha | G11C 7/1087 |
| 10,643,719 B2 | 5/2020 | Bradshaw | |
| 10,679,698 B2 | 6/2020 | Damle et al. | |
| 10,777,270 B2 | 9/2020 | Baek et al. | |
| 10,985,212 B2 | 4/2021 | Tortorelli | |
| 11,004,507 B2 | 5/2021 | Joo et al. | |
| 11,126,497 B2 | 9/2021 | Oh et al. | |
| 2014/0146624 A1 * | 5/2014 | Son | G06F 11/1048 |
| | | | 365/200 |
| 2015/0325292 A1 | 11/2015 | Scheuerlein | |

* cited by examiner 2100a, 2100b, and 2100c

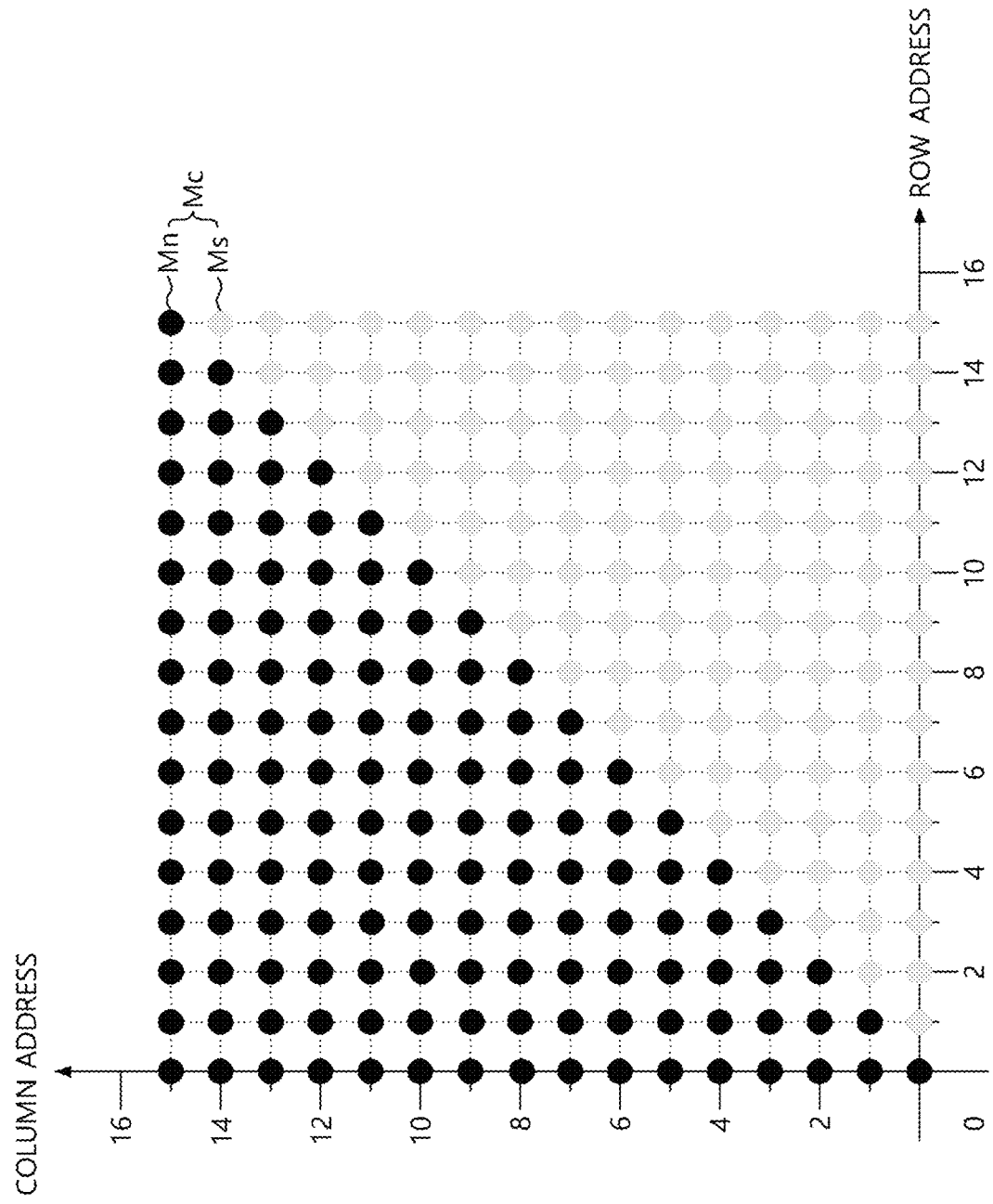

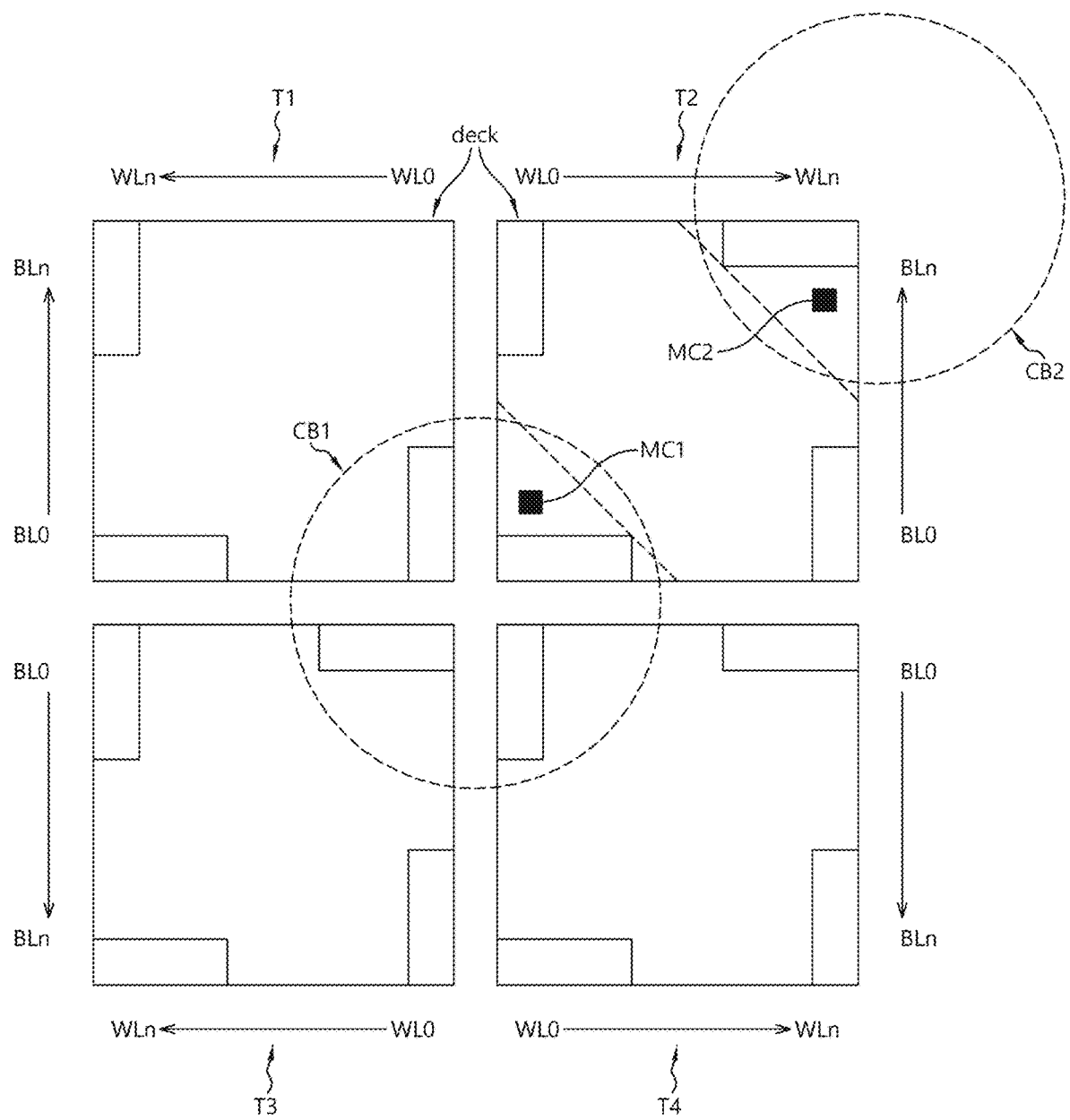

SEMICONDUCTOR MEMORY DEVICE, SEMICONDUCTOR MEMORY SYSTEM INCLUDING THE SAME, METHOD OF DRIVING THE SEMICONDUCTOR MEMORY SYSTEM

CROSS-REFERENCE TO RELATED APPLICATION

The present application is a divisional application of U.S. patent application Ser. No. 16/874,103, filed May 14, 2020, now U.S. Pat. No. 11,379,302, issued Jul. 5, 2022 and claims priority under 35 U.S.C. § 119(a) to Korean application number 10-2019-0102537, filed on Aug. 21, 2019, in the Korean Intellectual Property Office, which is incorporated herein by reference in its entirety.

BACKGROUND

1. Technical Field

Various embodiments may generally relate to a semiconductor memory device, a semiconductor memory system including the semiconductor memory device, and a method of driving the semiconductor memory system, more particularly, a semiconductor memory device capable of classifying a region of a memory deck based on a positional factor and a bit error ratio, a semiconductor memory system including the semiconductor memory device, and a method of driving the semiconductor memory system.

2. Related Art

Recently, next-generation memory devices have been widely developed as a substitute for DRAM and flash memory devices. The next-generation memory devices may include a resistive change memory device including a material with a resistance rapidly changed in accordance with an applied bias to switch at least two resistance states (i.e., a variable resistive material). The resistance change memory device may include a phase change random access memory (PCRM), a resistive random access memory (RRAM), a magnetic random access memory (MRAM), a ferroelectric random access memory (FRAM), etc.

The resistive change memory device may include a memory cell array having a cross point array structure. The cross point array structure may be arranged between a word line and a bit line where an access element and a memory cell may be alternately arranged.

The cross point array type resistive change memory device may have reliability problems such as read disturbance, cyclic endurance, etc., caused by a resistance difference between a cell that is near to a control block and a cell that is far from the control block.

SUMMARY

In example embodiments of the present disclosure, a semiconductor memory device may include a resistive change memory device including a control circuit block and a plurality of memory decks electrically connected with the control circuit block. The semiconductor memory device may include a pattern generation block, a position correction block and a position decision block. The pattern generation block may receive a row address, a column address and a deck selection signal to generate a plurality of pattern generation signals to select a plurality of memory cells in the memory deck in various patterns. The position correction block may receive a temporary code for classifying the memory cells into a temporary near cell region and a temporary far cell region and for reflecting a position of the memory deck in the temporary code to output a correction code. The position decision block may generate first to third reset signals to reset a near cell region, a middle cell region and a far cell region based on the pattern generation signals and the correction code.

In example embodiments of the present disclosure, a semiconductor memory system may include a controller and a memory device. The controller may include a temporary code setter that is configured to store and change information of a temporary cell region and a temporary far cell region of a memory deck as a temporary code. The controller may output the temporary code and addresses of selected memory cells. The memory device may include a plurality of the memory decks, a control circuit block, a region reset circuit and a bit error determination block. The control circuit block may be configured to generate signals for controlling the memory decks. The region reset circuit may receive the temporary code and the addresses to generate first to third reset signals to reset a far cell region, a middle cell region and a near cell region. The bit error determination block may receive the first to third reset signals to determine a bit error ratio of the memory decks based on regions of the memory deck. The temporary code setter may receive the bit error ration measured by the bit error determination block to change a boundary of the temporary far cell region and to output the temporary code.

In example embodiments of the present disclosure, in a method of driving a semiconductor memory system, a bit error ration of a memory deck by a region, which may be classified into a far cell region, a middle cell region and a near cell region, may be measured. The measured bit error ratio of a selected region, among the cell regions, may be compared to a target bit error ration of the selected region. When the measured bit error ratio is greater than the target bit error ratio, the temporary code may be changed to increase an area of the selected region.

BRIEF DESCRIPTION OF THE DRAWINGS

The above and another aspects, features and advantages of the subject matter of the present disclosure will be more clearly understood from the following detailed description taken in conjunction with the accompanying drawings, in which:

FIG. 15 is a graph, showing a distribution of a selected memory cell of a memory deck, in accordance with a fifth pattern generation signal;

FIG. 17 is a plan view, illustrating a distribution of a near cell region of a deck by a tile, in accordance with example embodiments;

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
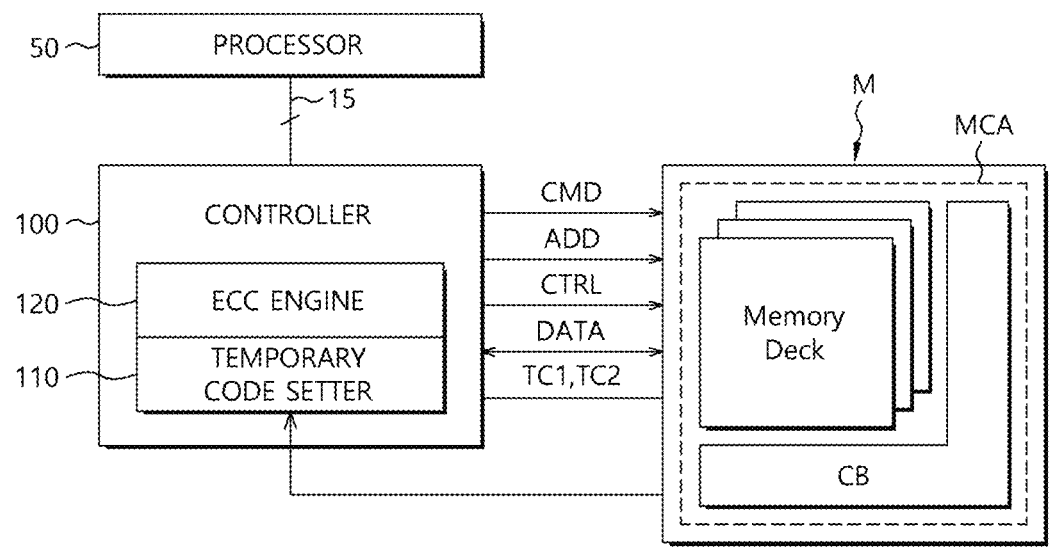
FIG. 1 is a block diagram, illustrating a semiconductor memory system, in accordance with example embodiments.
Figure 2:
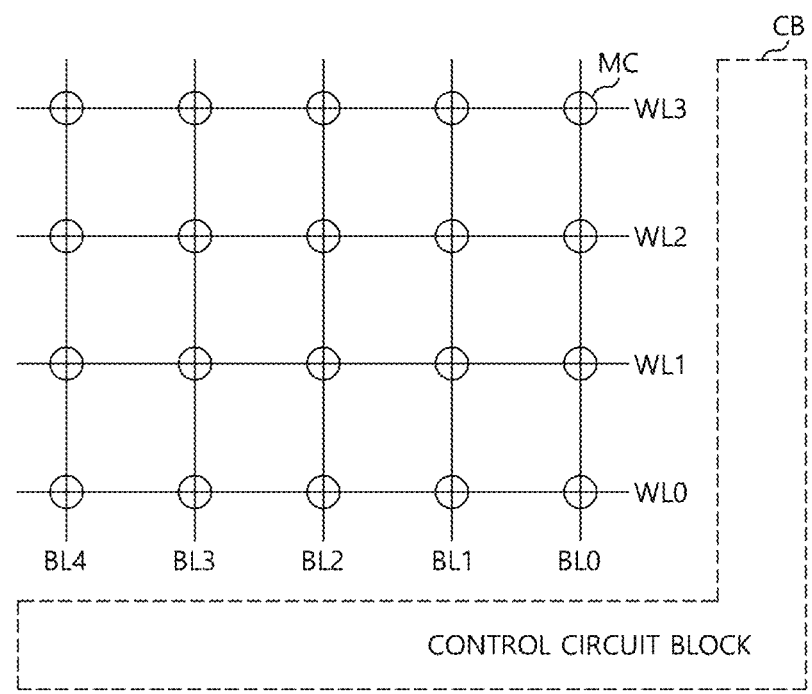
FIG. 2 is a view, illustrating a memory cell array (MCA) of a resistive change memory device, in accordance with example embodiments.
Figure 3:
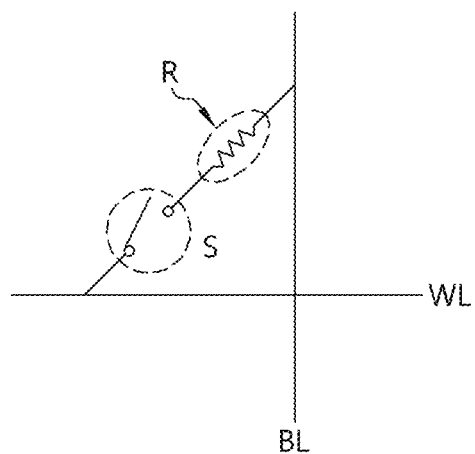
FIG. 3 is a circuit diagram, illustrating a memory cell, in accordance with example embodiments.

FIG. 1 is a block diagram, illustrating a semiconductor memory system, in accordance with example embodiments;

FIG. 2 is a view, illustrating a memory cell array (MCA) of a resistive change memory device, in accordance with example embodiments, and FIG. 3 is a circuit diagram, illustrating a memory cell, in accordance with example embodiments.

Referring to FIG. 1, a semiconductor memory system 10 may include a processor 50, a controller 100, and a semiconductor memory device M.

The processor 50 may be electrically connected with the controller 100 through a bus 15. The processor 50 may provide the controller 100 with a memory address, a memory access request (including data such as a read request), a write request, etc.

The controller 100 may provide the semiconductor memory device M with a command CMD, an address ADD, data DATA, and a control signal CTRL using the memory access request. The controller 100 may include a temporary code setter 110 configured to receive a bit error ratio from the semiconductor memory device M. The temporary code setter 110 may store and set temporary codes TC1 and TC2. The temporary codes TC1 and TC2 may include address information to define a boundary between a far cell region and a near cell region based on the bit error ratio of the semiconductor memory device M. Configurations and operations of the temporary code setter 110 will be described later. The controller 100 may include an ECC engine 120. The ECC engine 120 and the temporary code setter 110 may both receive the bit error ratio from the semiconductor memory device M. The ECC engine 120 may be designed to have a correctable error amount of the semiconductor memory device M.

In an embodiment, the semiconductor memory device M may include at least one memory cell array MCA. For example, the memory cell array MCA may include a plurality of memory decks and a control circuit block CB to control the operations of the memory decks.

Each of the memory decks may include a plurality of memory cells using a variable resistance element as a storage medium. Thus, the semiconductor memory device M may include a resistive memory device.

Referring to FIG. 2, the memory deck may include a plurality of word lines WL0~WL3 and a plurality of bit lines BL0~BL4. The word lines WL0~WL3 and the bit lines BL0~BL4 may intersect each other. The memory deck may include a plurality of memory cells MC, arranged at intersected points between the word lines WL0~WL3 and the bit lines BL0~BL4. The structure, including the memory cells MC at the crossed points between the word lines WL0~WL3 and the bit lines BL0~BL4, may be referred to as a cross point array structure.

Referring to FIG. 3, the memory cell MC may include a combination of a selection element S and a variable resistance R, connected between the word line WL and the bit line BL. The combination of a selection element S and a variable resistance R may be included at each point of intersection between the word line WL and the bit line BL. The selection element S may include a diode or a MOS transistor. The selection element S may use an Ovonic threshold switch (OTS), which includes a phase change memory layer.

The variable resistance R may correspond to the storage medium. The variable resistance R may represent different resistance values based on the voltage difference between the bit line BL and the word line WL. The variable resistance R may include a phase change layer or a resistance change layer. The phase change layer may include GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc.

The phase change layer may have an amorphous state having a relatively high resistance and a crystalline state having a relatively low resistance. The phase change layer may have phases changed by Joule's heat, generated by an amount of a current and a cooling time.

Each of the memory cells may include a single level cell configured to store one bit of data. In this case, the memory cell may have two resistance distributions in accordance with the stored data. Alternatively, each of the memory cells may include a multi-level cell configured to store no less than two bits of data. In this case, the memory cell may have four or eight resistance distributions in accordance with the stored data.

In the cross point array type memory deck, memory cells that are close to the control circuit block CB (hereinafter, referred to as a near cell) may have read disturbance and cyclic endurance inferior to those of cells that are far from the control circuit block CB (hereinafter, referred to as a far cell).

Therefore, a conventional controller may arbitrarily classify and control the memory cell array MCA (i.e., the memory deck) into a near cell region, close to the control circuit block CB, and a far cell region, far from the control circuit block CB, based on the address of a selected memory cell MC. However, because the memory decks of the semiconductor memory device may be three-dimensionally arranged, it may be difficult to accurately control the memory decks based on the two-dimensional classification.

Figure 4:
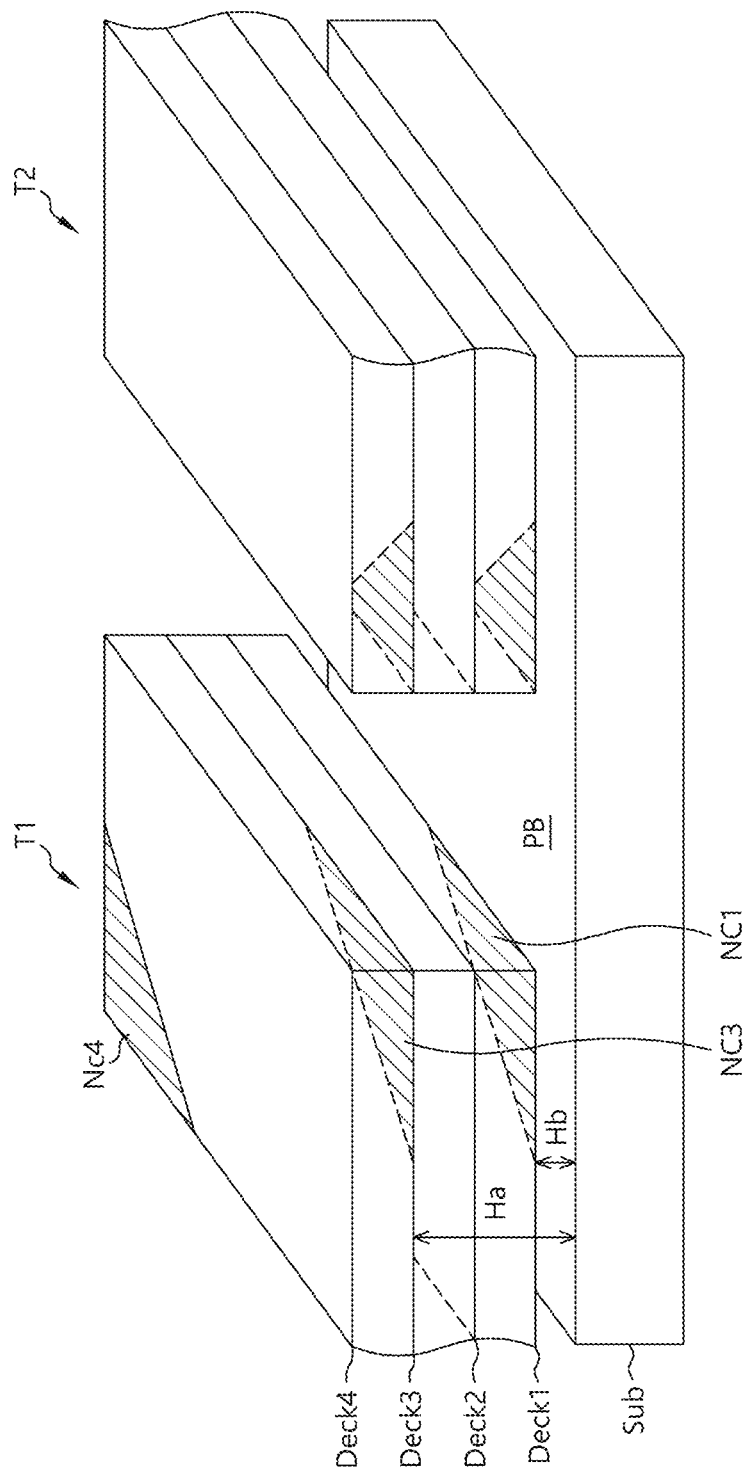
FIG. 4 is a perspective view, illustrating a memory cell array of a stack type resistive change memory cell device, in accordance with example embodiments.

FIG. 4 is a perspective view, illustrating a memory cell array of a stack type resistive change memory cell device, in accordance with example embodiments.

Referring to FIG. 4, a semiconductor substrate Sub may include a plurality of tile regions (T1 and T2) or MAT regions where the memory cell array MCA may be formed, and a peripheral circuit region PB.

A plurality of memory decks Deck1~Deck4 may be stacked in each of the tile regions T1 and T2. However, the invention is not limited thereto. In different embodiments, the four memory decks Deck1, Deck2, Deck3 and Deck4 may be stacked in only one of the tile regions T1 or T2.

The control circuit block CB may be extended to the tile regions T1 and T2 and/or the peripheral circuit region PB between the tile regions T1 and T2. For example, the control circuit block CB may be integrated in the semiconductor substrate Sub under the memory decks Deck1~Deck4.

Because the memory decks Deck1~Deck4 may be three-dimensionally stacked, a three dimensional distance of the control circuit block CB (i.e., heights Ha and Hb) needs to be reflected in variables to classify the near cell regions and the far cell regions. For example, when comparing a near cell region NC3 of the third memory deck Deck3 to a near cell region NC1 of the first memory deck Deck1, it may be difficult to determine the near cell region NC3 of the third memory deck Deck3 as the near cell region NC.

Thus, it may be required to reset the near cell region and the far cell region of the stack type variable resistance memory device based on the three-dimensional positions of the memory cell and the actual error ratio.

Figure 5:
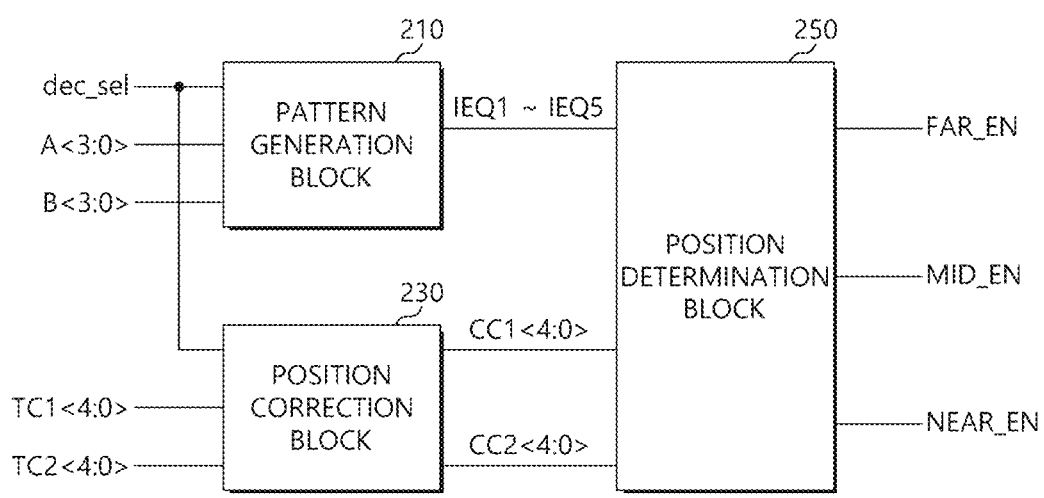
FIG. 5 is a block diagram, illustrating a region reset circuit, in accordance with example embodiments.

FIG. 5 is a block diagram, illustrating a region reset circuit, in accordance with example embodiments. For example, each of the memory decks Deck1~Deck4 may include 16×16 memory cell regions. For example, the memory cell region may be selected by four most significant bits (MSBs) of the row address A<3:0> (hereinafter, MSBs row address) and four MSBs of the column address B<3:0> (hereinafter MSBs column address). Further, in order to classify the region, sizes of the MSBs may be increased.

Referring to FIG. 5, a region reset circuit 200 may be integrated into the control circuit block CB of the semiconductor memory device M. Further, the region reset circuit 200 may be integrated into the semiconductor memory device M without being integrated into the control circuit block CB.

The region reset circuit 200 may include a pattern generation block 210, a position correction block 230, and a position determination block 250.

The pattern generation block 210 may receive a deck selection signal dec_sel, the MSBs row address A<3:0>, and the MSBs column address B<3:0> to generate a plurality of pattern generation signals IEQ1~IEQ5.

The first pattern generation signal IEQ1 may alternately turn-on the memory cells in the memory deck by one bit. The second pattern generation signal IEQ2 may alternately turn-on the memory cells in the memory deck by two bits. The third pattern generation signal IEQ3 may alternately turn-on the memory cells in the memory deck by four bits. The fourth pattern generation signal IEQ4 may alternately turn-on the memory cells in the memory deck by eight bits. The fifth pattern generation signal IEQ5 may alternately turn-on the memory cells in the memory deck by sixteen bits.

The position correction block 230 may receive the deck selection signal dec_sel and the temporary codes TC1 <4:0> and TC2 <4:0> to generate correction codes CC1 <4:0> and CC2 <4:0> in which stacked positions of the memory decks Deck2~Deck4 may be reflected.

The position determination block 250 may receive the pattern generation signals IEQ1~IEQ5 and the correction codes CC1 <4:0> and CC2 <4:0> to generate position reset signals FAR_EN, MID_EN and NEAR_EN.

Figure 6:
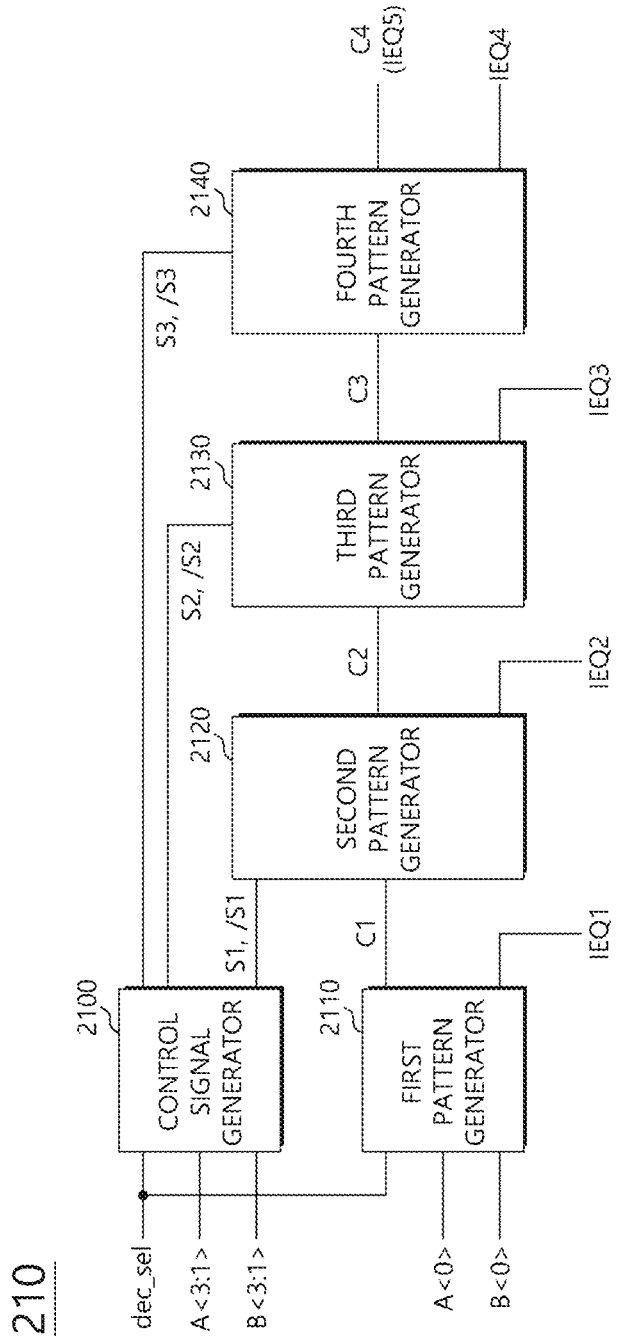
FIG. 6 is a block diagram, illustrating a pattern generation block, in accordance with example embodiments.
Figure 7:
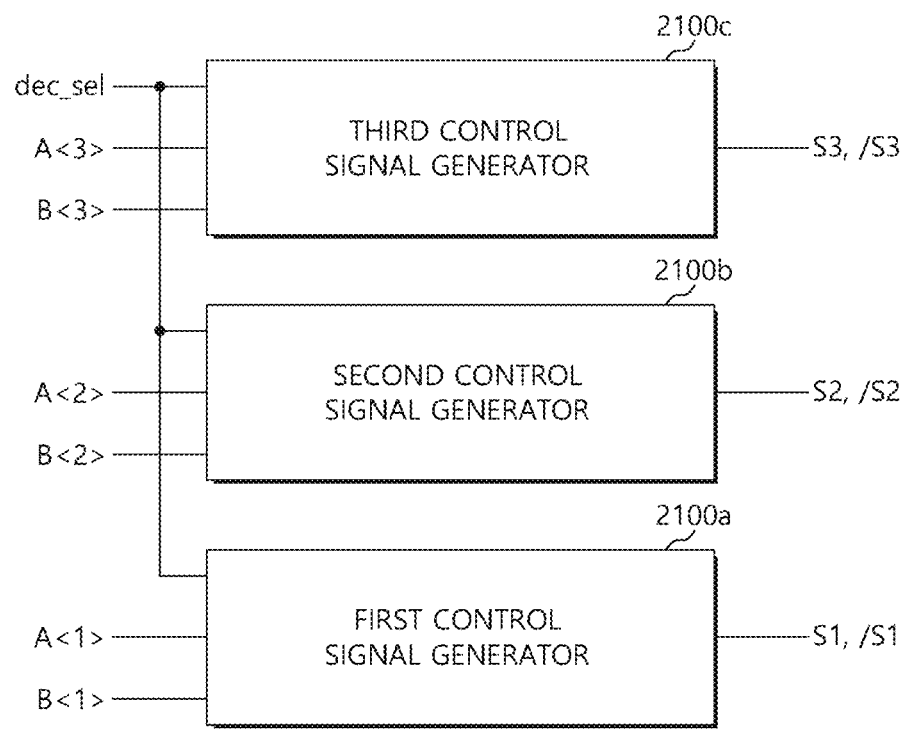
FIG. 7 is a block diagram illustrating a control signal generator in FIG. 6.
Figure 8:
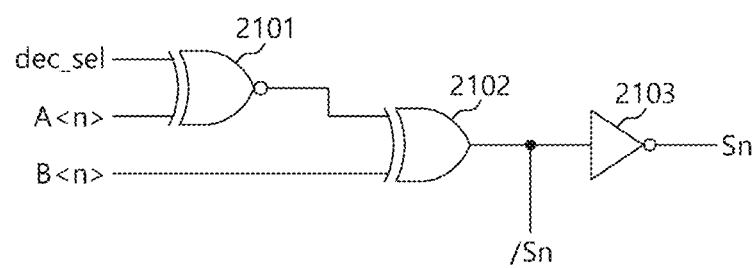
FIG. 8 is a circuit diagram illustrating first to third control signal generators in FIG. 7.

FIG. 6 is a block diagram, illustrating a pattern generation block, in accordance with example embodiments, FIG. 7 is a block diagram illustrating a control signal generator in FIG. 6, and FIG. 8 is a circuit diagram illustrating first to third control signal generators in FIG. 7.

Hereinafter, the MSB row address A<3:0> and the MSB column address B<3:0>, for selecting the 16×16 memory cell regions, may be indicated by A<3>, A<2>, A<1>, A<0>, B<3>, B<2>, B<1> and B<0> in a binary notation.

Referring to FIGS. 6 to 8, the pattern generation block 210 may include a control signal generator 2100, a first pattern generator 2110, a second pattern generator 2120, a third pattern generator 2130, and a fourth pattern generator 2140.

The control signal generator 2100 may include a first control signal generator 2100a, a second control signal generator 2100b, and a third control signal generator 2100c.

The first control signal generator 2100a may logically operate the second bit A<1> of the row address A<3:0> and the second bit B<1> of the column address B<3:0> to generate a first control signal S1 and a first inverted control signal /S1.

The second control signal generator 2100b may logically operate the third bit A<2> of the row address A<3:0> and the third bit B<2> of the column address B<3:0> to generate a second control signal S2 and a second inverted control signal /S2.

The third control signal generator 2100c may logically operate the MSB A<3> of the row address A<3:0> and the MSB B<3> of the column address B<3:0> to generate a third control signal S3 and a third inverted control signal /S3.

In example embodiments, the first to third control signal generators 2100a, 2100b and 2100c may have substantially the same configuration.

For example, as shown in FIG. 8, each of the first to third control signal generators 2100a, 2100b and 2100c may be configured to perform an exclusive NOR operation, exclusive OR operation, and an inversion operation. For example, each of the first to third control signal generators 2100a, 2100b and 2100c may include an exclusive NOR gate 2101, an exclusive OR gate 2102 and an inverter 2103.

The exclusive NOR gate 2101 may receive the deck selection signal dec_sel and a row address bit A<n> (n=1, 2, or 3) to perform an exclusive NOR operation. The exclusive OR gate 2102 may perform an exclusive OR operation using the output signal from the exclusive NOR gate 2101 and a column address bit B<n> (n=1, 2, or 3) to generate the first to third inverted control signals /S1, /S2, and /S3. The inverter 2103 may invert the first to third inverted control signals /S1, /S2, and /S3 to generate the first to third control signals S1, S2, and S3.

Figure 9:
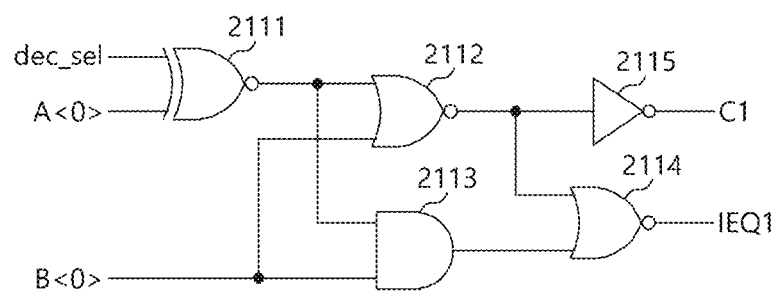
FIG. 9 is a circuit diagram, illustrating a first pattern generator, in accordance with example embodiments.

FIG. 9 is a circuit diagram, illustrating a first pattern generator, in accordance with example embodiments.

Referring to FIGS. 6 and 9, the first pattern generator 2110 may generate the first pattern generation signal IEQ1 to alternately select the memory cells by one bit in the memory deck included in the 16×16 memory cell regions.

The first pattern generator 2110 may receive the deck selection signal dec_sel, a least significant bit (LSB) row address A<0> and the LSB column address B<0> to generate the first pattern generation signal IEQ1, turned-on by one bit.

The first pattern generator 2110 may be configured to perform an exclusive NOR operation, first and second NOR operations, an AND operation, and an inversion operation. The first pattern generator 2110 may include an exclusive NOR gate 2111, a first NOR gate 2112, an AND gate 2113, a second NOR gate 2114 and an inverter 2115.

The exclusive NOR gate 2111 may receive and perform an exclusive NOR operation on the deck selection signal dec_sel and the LSB row address A<0>. The first NOR gate 2112 may perform a NOR operation by using the output signal from the exclusive NOR gate 2111 and the LSB column address B<0>. The inverter 2115 may invert the output signal from the first NOR gate 2112 to generate a first carry signal C1. The and gate 2113 may perform an and operation using the output signal from the exclusive NOR gate 2111 and the LSB column address B<0>. The second NOR gate 2114 may perform a NOR operation using the output signal from the first NOR gate 2112 and an output signal from the and gate 2113 to generate the first pattern generation signal IEQ1. The first pattern generation signal IEQ1 may be enabled to a high level when the LSB row address A<0> is substantially the same as the LSB column address B<0>. The first carry signal C1 may be enabled to a high level when the LSB row address A<0> is higher than the LSB column address B<0>.

Figure 10:
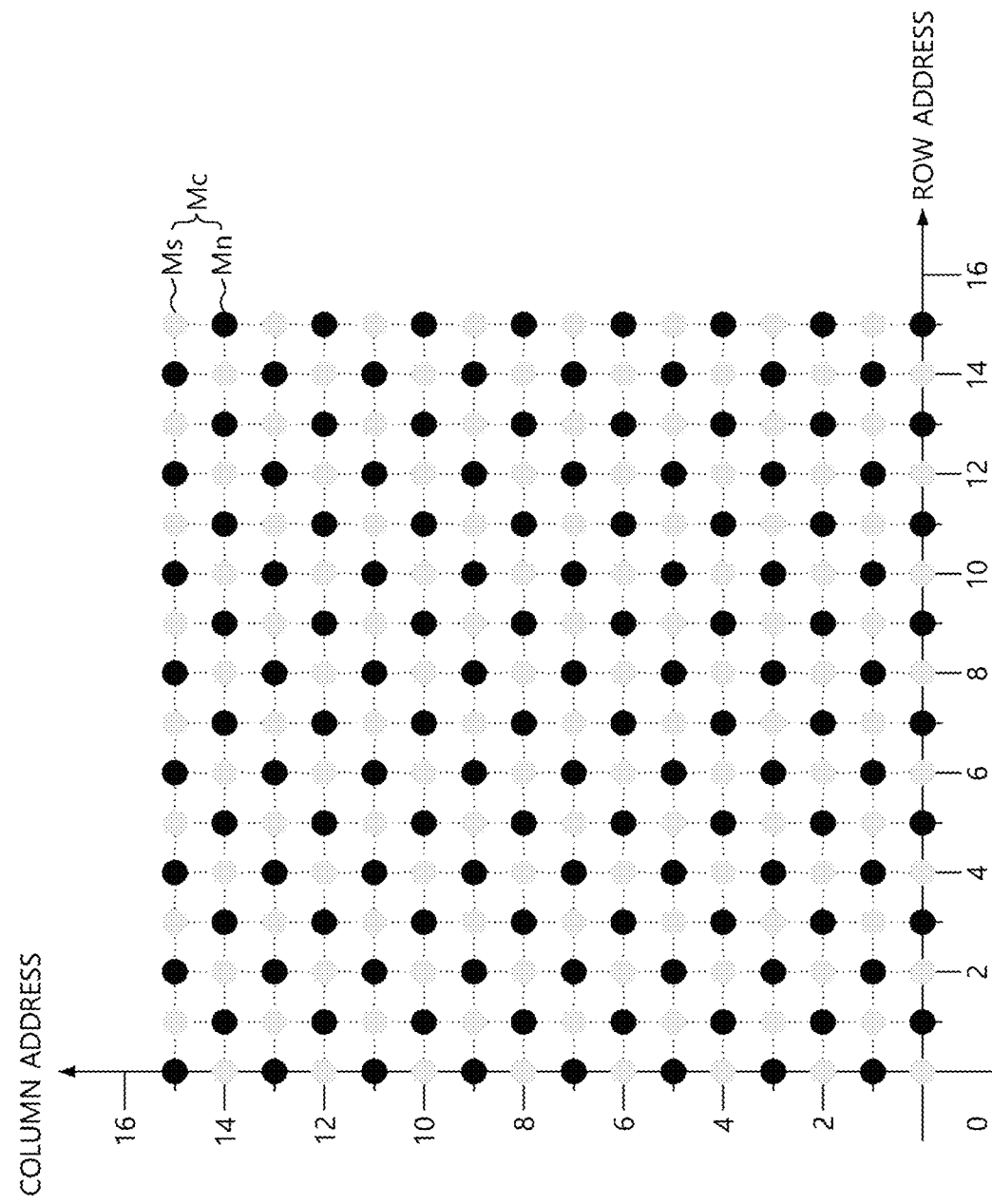
FIG. 10 is a graph, showing a distribution of a selected memory cell, in accordance with a first pattern generation signal.

FIG. 10 is a graph showing a distribution of a selected memory cell in accordance with a first pattern generation signal. In FIG. 10, the x-axis may represent the row address A<3:0> in a decimal number, and the y-axis may represent the column address B<3:0> in a decimal number. An Ms among the memory cells MC may represent a selected memory cell and an Mn may represent a non-selected memory cell.

Referring to FIG. 10, the memory cells Mc in the memory deck may be alternately selected by the first pattern generation signal IEQ1 in the row and column address directions by one bit. Since the first pattern generation signal IEQ1 may be generated by combining the LSB row address A<0> and the LSB B<0> of the column address, selecting the memory cells may be controlled by one bit.

Figure 11:
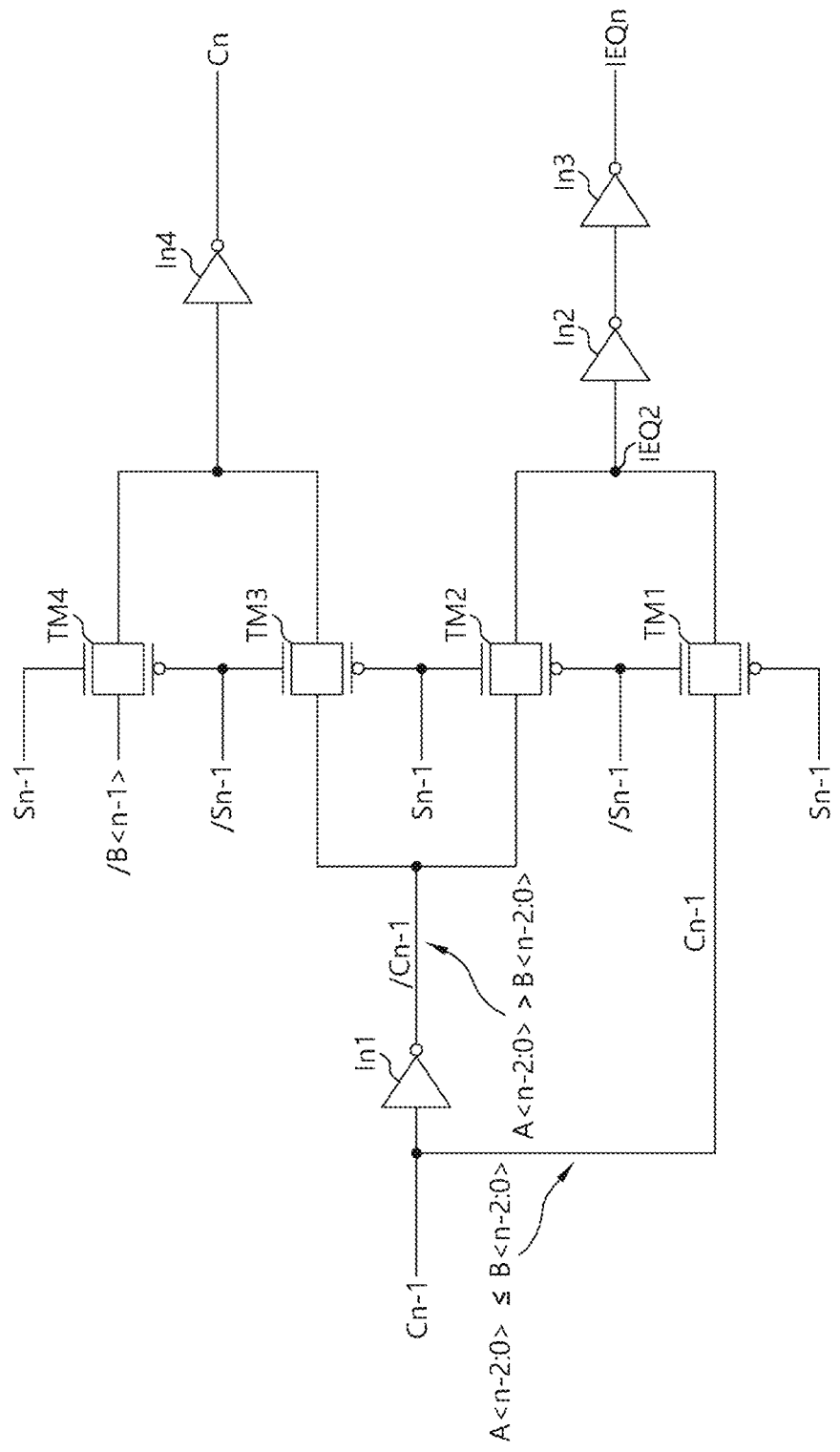
FIG. 11 is a circuit diagram, illustrating an nth pattern generator (n=2, 3, 4), in accordance with example embodiments.

FIG. 11 is a circuit diagram, illustrating an nth pattern generator (n=2, 3, 4), in accordance with example embodiments. The second to fourth pattern generators 2120, 2130, and 2140 may have substantially the same configuration. Thus, the second to fourth pattern generators 2120, 2130 and 2140 may be referred to as the nth pattern generator (n=2, 3 or 4).

The nth pattern generator 2120, 2130, and 2140 may be configured to perform inversion operations and transfer operations. The nth pattern generator 2120, 2130, and 2140 may include first to fourth inverters In1~In4 and first to fourth transfer gates TM1~TM4.

The first inverter In1 may invert a (n−1)th carry signal Cn−1, provided from an (n−1)th pattern generator, to output an (n−1)th inverted carry signal /Cn−1.

The first transfer gate TM1 may output the carry signal Cn−1 in response to a pair of the (n−1)th control signals Sn−1 and /Sn−1. The second and third transfer gates TM2 and TM3 may output the inverted carry signal /Cn−1 in response to a pair of the (n−1)th control signals Sn−1 and /Sn−1. The (n−1)th control signal Sn−1 may be inputted into an NMOS transistor of the second transfer gate TM2, a PMOS transistor of the third transfer gate TM3 and an NMOS transistor of the fourth transfer gate TM4. The (n−1)th inverted control signal /Sn−1 may be inputted into a PMOS transistor of the second transfer gate TM2, an NMOS transistor of the third transfer gate TM3 and a PMOS transistor of the fourth transfer gate TM4. The fourth transfer gate TM4 may output an inverted (n−1)th column address bit /B<n−1> in response to the (n−1)th control signals Sn−1 and /Sn−1.

The second inverter In2 may invert and output an output signal from the first transfer gate TM1 or the second transfer gate TM2.

The third inverted In3 may invert an output signal from the second inverter In2 to generate an nth pattern generation signal IEQn. The fourth inverter In4 may invert an output signal from the third transfer gate TM3 or the fourth transfer gate TM4 to output the nth carry signal Cn.

For example, when n is 2, the second pattern generator 2120 may be operated as follows.

When the LSB row address A<0> is higher than the LSB column address B<0>, the first carry signal C1, enabled to a high level, may be inputted into the first inverter In1. Thus, the first inverter In1 may invert and output the first carry signal C1. When the LSB row address A<0> is equal to or lower than the LSB column address B<0>, the first inverted carry signal /C1 may be enabled to a high level.

Based on the levels of the control signals Sn−1, /Sn−1, the second inverter In2 receives the first inverted carry signal /C1 and outputs a buffered first carry signal C1. When the LSB row address A<0> is bigger than the LSB column address B<0>, the buffered first carry signal C1 may be enabled to a high level.

When the second bit row address A<1> is different from the second bit column address B<1>, the first control signal S1, generated by the first control signal generator 2100a in FIGS. 7 and 8, may be enabled to a high level.

Therefore, when the first control signal S1 is low (i.e., the second bit row address A<1> is substantially the same as the second bit column address B<1>), the first transfer gate TM1 may output the first carry signal C1 as the second pattern signal IEQ2. That is, when the LSB row address A<0> is equal to or lower than the LSB column address B<0> and the second bit row address A<1> is substantially the same as the second bit column address B<1>, the second pattern signal IEQ2 may be enabled to a high level.

When the first control signal S1 is high (i.e., the second bit row address A<1> is different from the second bit column address B<1>), the second transfer gate TM2 may output the inverted first carry signal /C1 as the second pattern signal IEQ2. When the first bit row address A<0> is bigger than the first bit row address B<0> and the second bit row address A<1> is different from the second bit column address B<1>, the second pattern signal IEQ2, outputted from the second transfer gate TM2, may be enabled to a high level.

When the first control signal S1 is low (i.e., the second bit row address A<1> is substantially the same as the second bit column address B<1>), the third transfer gate TM3 may output the inverted first carry signal /C1 enabled to a high level. The fourth inverter In4 may invert the inverted first carry signal /C1 to output the second carry signal C2.

When the first control signal S1 is high (i.e., the second bit row address A<1> is different from the second bit column address B<1>), the fourth transfer gate TM4 may output an inverted second bit column address /B<1>. The fourth inverter In4 may output the second bit column address B<1> as the second carry signal C2.

Figure 12:
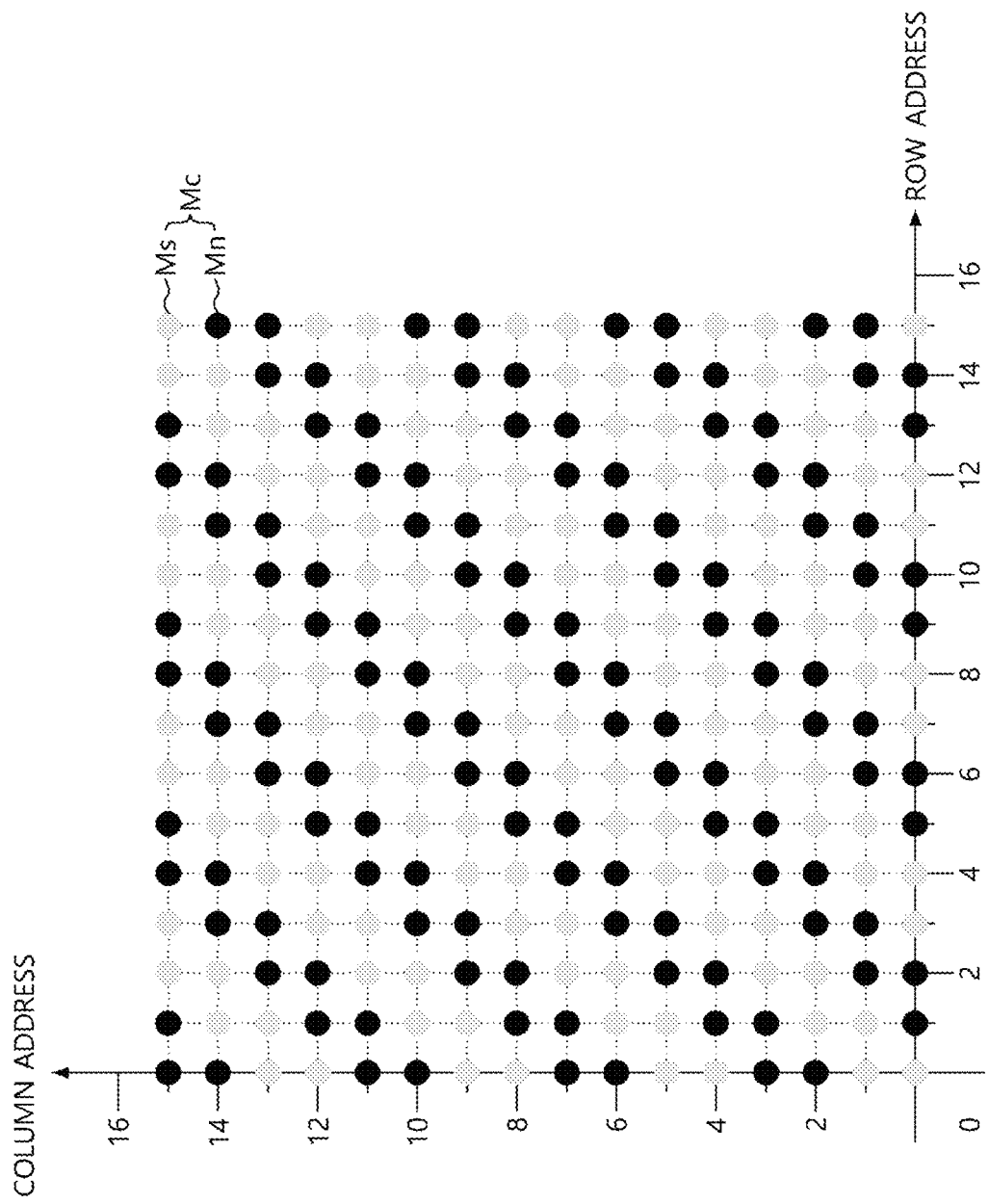
FIG. 12 is a graph, showing a distribution of a selected memory cell of a memory deck, in accordance with a second pattern generation signal.
Figure 13:
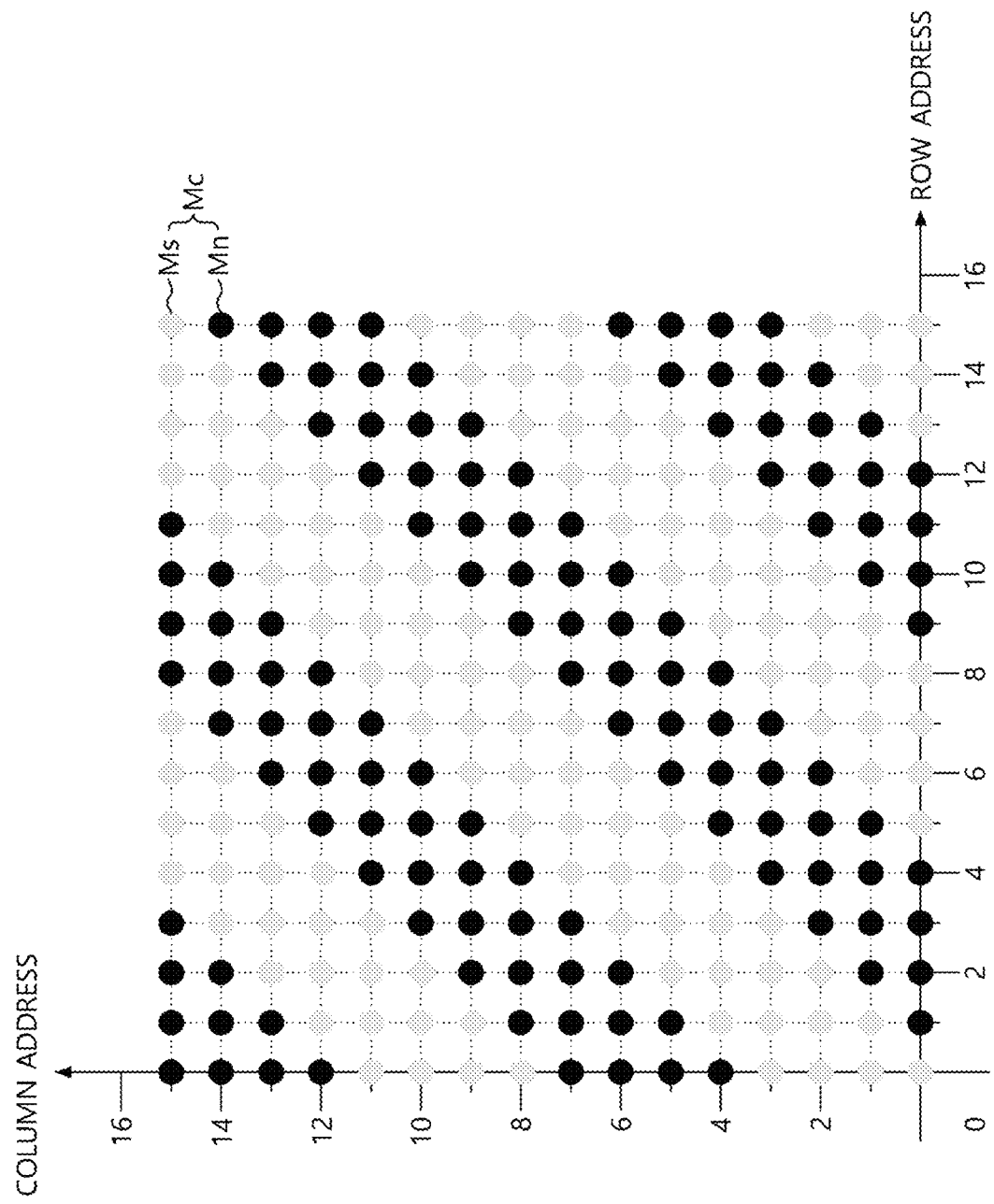
FIG. 13 is a graph, showing a distribution of a selected memory cell of a memory deck, in accordance with a third pattern generation signal.
Figure 14:
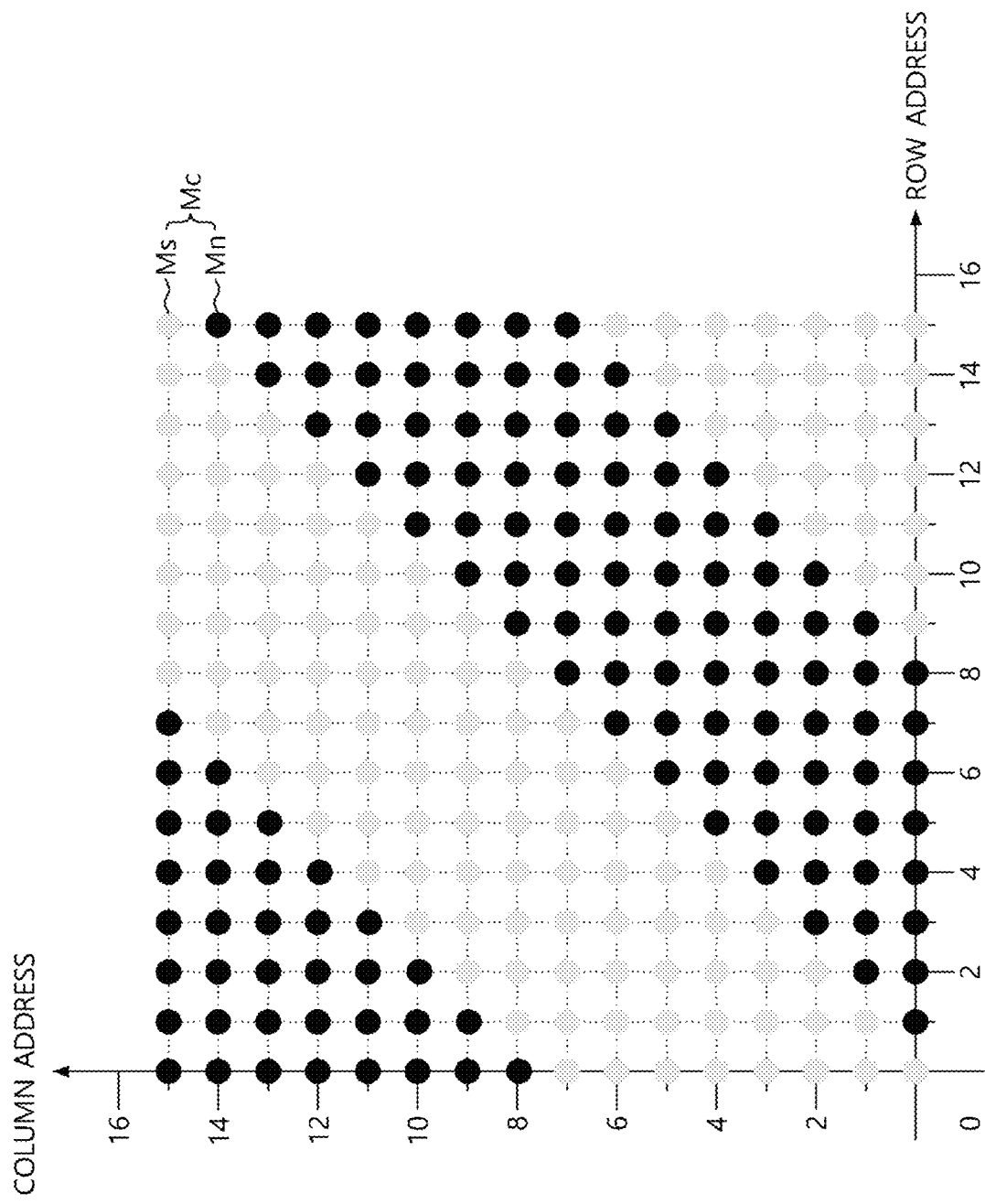
FIG. 14 is a graph, showing a distribution of a selected memory cell of a memory deck, in accordance with a fourth pattern generation signal.

FIG. 12 is a graph, showing a distribution of a selected memory cell of a memory deck, in accordance with a second pattern generation signal, FIG. 13 is a graph, showing a distribution of a selected memory cell of a memory deck, in accordance with a third pattern generation signal, FIG. 14 is a graph, showing a distribution of a selected memory cell of a memory deck, in accordance with a fourth pattern generation signal, and FIG. 15 is a graph, showing a distribution of a selected memory cell of a memory deck, in accordance with a fifth pattern generation signal.

In FIGS. 12 to 15, the x-axis may represent the row address in a decimal number, and the y-axis may represent the column address in a decimal number.

As shown in FIG. 12, the second pattern generation signal IEQ2 may alternately select the memory cell regions by two bits in the row and column directions on the memory deck in accordance with the operations of the nth pattern generator 2120, 2130, and 2140.

As shown in FIG. 13, the third pattern generation signal IEQ3 may alternately select the memory cell regions by four bits in the row and column directions on the memory deck.

As shown in FIG. 14, the fourth pattern generation signal IEQ4 may alternately select the memory cell regions by eight bits in the row and column directions on the memory deck.

As shown in FIG. 15, the fifth pattern generation signal IEQ5 may alternately select the memory cell regions by sixteen bits in the row and column directions on the memory deck.

The fifth pattern generation signal IEQ5 may correspond to the fourth carry signal C4 of the fourth pattern generator 2140. Thus, when all of the row address bits A<3>, A<2>, A<1> and A<0> are bigger than all of the column address bits B<3>, B<2>, B<1> and B<0>, the fifth pattern generation signal IEQ5 may be enabled to a high level. As a result, the fifth pattern generation signal IEQ5 may turn-on the memory cells by sixteen bits in the row and column directions on the memory deck.

FIGS. 9 and 11 may show an example with the pattern generator that selects the memory cells by one bit, two bits, four bits, eight bits and sixteen bits. However, the invention is not limited thereto.

Figure 16A:
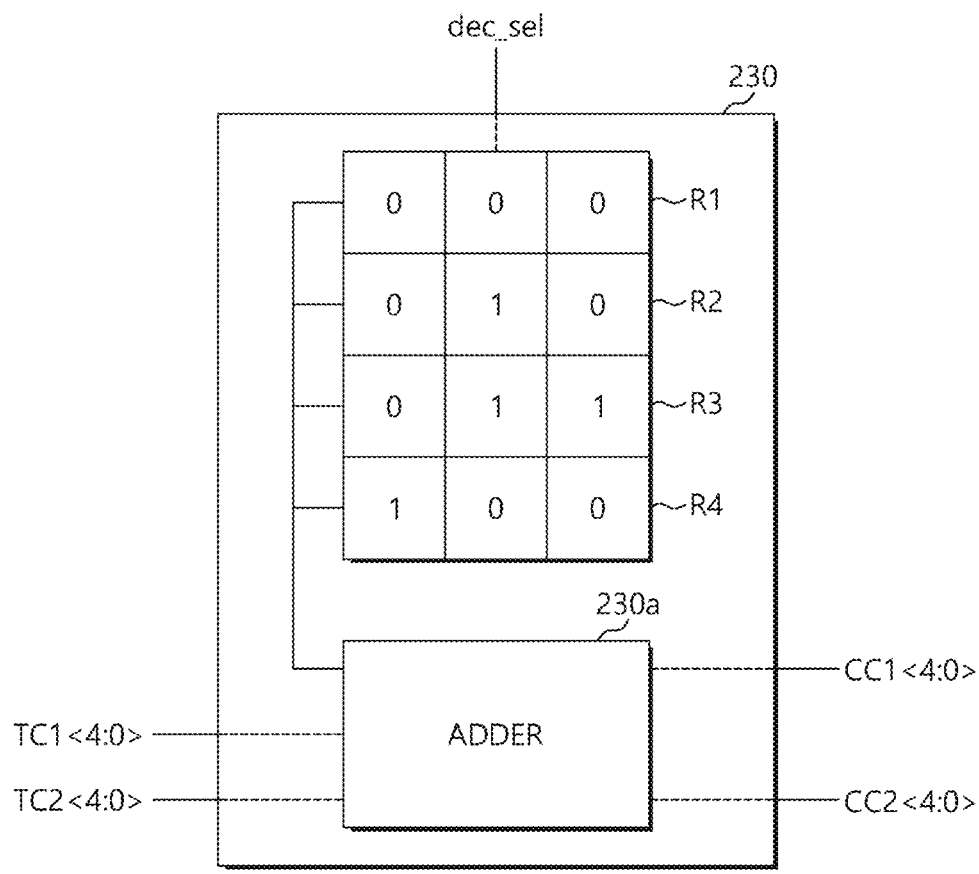
FIGS. 16A and 16B are block diagrams, illustrating a position correction block 230, in accordance with example embodiments.
Figure 16B:
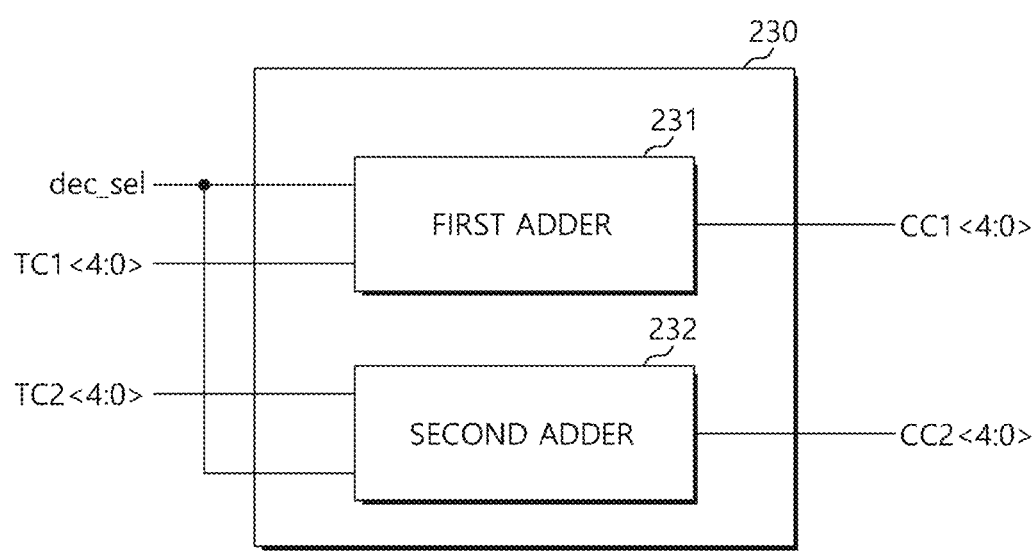

FIGS. 16A and 16B are block diagrams, illustrating a position correction block 230, in accordance with example embodiments.

Referring to FIGS. 16A and 16B, the position correction block 230 may receive the temporary codes TC1 <4:0> and TC2 <4:0> as a binary code. The position correction block 230 may reflect variable positions of the stacked memory decks in the temporary codes TC1 <4:0> and the TC2 <4:0> to output correction codes CC1 <4:0> and CC2 <4:0>.

For example, the temporary codes may further include a boundary address information between the far cell region and the near cell region, provided from the temporary code setter 110 of the controller 100. The temporary codes may include the first temporary code TC1 <4:0> and the second temporary code TC2 <4:0>. Reasons for classifying and controlling the temporary code into the first temporary code TC1 <4:0> and the second temporary code TC2 <4:0> will be described in detail with reference to FIG. 17.

FIG. 17 is a plan view, illustrating a distribution of a near cell region of a deck by a tile, in accordance with example embodiments.

Referring to FIG. 17, in order to effectively electrically connect the memory decks on the same plane arranged on the adjacent tiles T1~T4, the control circuit blocks CB1 and CB2 may be arranged symmetrically with each other. Thus, the memory cell MC1 and MC2 may be involved in the near cell region or the far cell region in accordance with positions of the control circuit blocks CB1 and CB2.

For example, when a memory cell MC1, connected to the control circuit block CB1, is selected, the memory cell MC1 may be classified as a near cell region. A memory cell MC2, connected to the control circuit block CB1, may be classified as a far cell region. In contrast, when the memory cell MC2, connected to the control circuit block CB2, is selected, the memory cell MC2 may be classified into the near cell region. Accordingly, the memory cell MC1 may be classified as a far cell region based on the control circuit block CB2. Thus, the far cell region and the near cell region of the memory deck may be changed based on the positions of the selected memory cells and to which control circuit block it is connected to. Therefore, in order to accurately identify the positions of the selected memory cells, the two temporary codes TC1 <4:0> and TC2 <4:0> are necessary.

In other words, the temporary code needs the first temporary code TC1 <4:0> and the second temporary code TC2 <4:0> to consider the relative position of the selected memory cell.

Referring back to FIG. 16A, the position correction block 230 may include an adder 230a configured to accumulate specific bits in response to the deck selection signal dec_sel.

The position correction block 230 may include a first register R1 that is configured to store 000 bit indicating the first memory deck Deck1, a second register R2 configured to store 010 bit indicating the second memory deck Deck2, a third register R3 configured to store 011 bit indicating the third memory deck Deck3, and a fourth register R4 configured to store 100 bit indicating the fourth memory deck Deck4.

The deck selection signal dec_sel may enable any one of the first to fourth registers R1~R4. The adder 230 may add bits in the enabled registers R1~R4 to the temporary codes TC1 <4:0> and TC2 <4:0> to output the correction codes CC1 <4:0> and CC2 <4:0>.

For example, the correction codes CC1 <4:0> and CC2 <4:0> may include the boundary address information. The boundary address information of the correction codes CC1 <4:0> and CC2 <4:0> may be different depending on the position (or height) of the memory decks.

Referring to FIG. 16B, the position correction block 230 may add the deck selection signal dec_sel to the temporary codes TC1 <4:0> and TC2 <4:0> to output the correction codes CC1 <4:0> and CC2 <4:0>. The position correction block 230 may include a first adder 231 and a second adder 232. For example, the deck selection signal dec_sel may include three or five bits, increased in accordance with the positions of the memory decks.

The first adder 231 may add the deck selection signal dec_sel to the first temporary code TC1 <4:0> to generate the first correction code CC1 <4:0>. The second adder 232 may add the deck selection signal dec_sel to the second temporary code TC2 <4:0> to generate the second correction code CC2 <4:0>.

Figure 18:
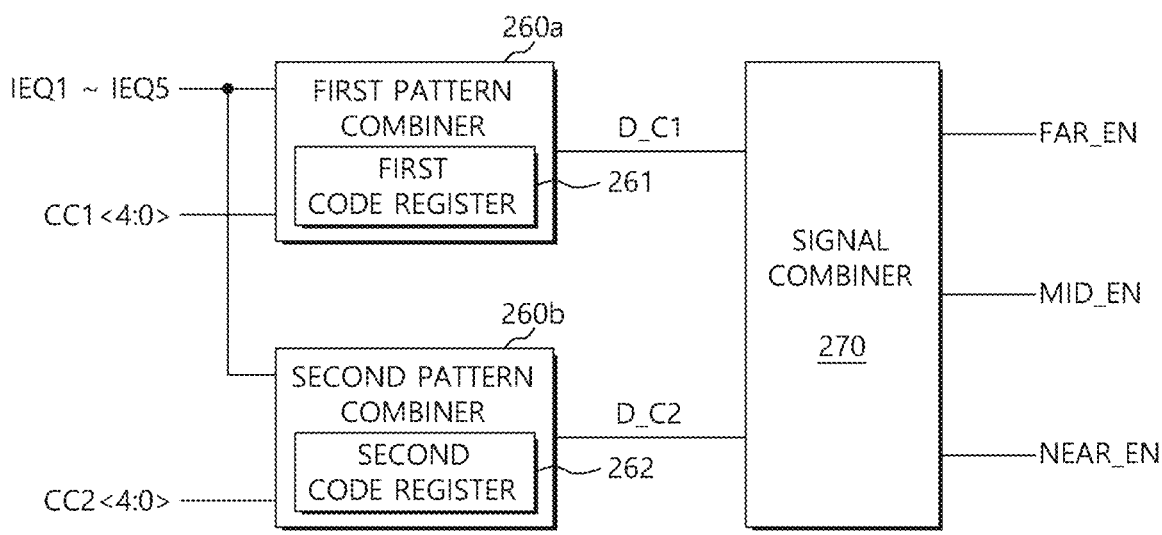
FIG. 18 is a block diagram, illustrating a position decision block, in accordance with example embodiments.

FIG. 18 is a block diagram, illustrating a position decision block, in accordance with example embodiments.

Referring to FIG. 18, the position determination block 250 may include a first pattern combiner 260a, a second pattern combiner 260b, and a signal combiner 270.

The first pattern combiner 260a may receive the first to fifth pattern generation signals IEQ1~IEQ5 and the first correction code CC1 <4:0> to generate a first region set code D_C1. For example, when the memory cell, connected to the first control block CB1 of the memory deck, is selected, the far cell region or the near cell region of the memory deck may be reset by the first region set code D_C1.

The second pattern combiner 260b may receive the first to fifth pattern generation signals IEQ1~IEQ5 and the second correction code CC2 <4:0> to generate a second region set code D_C2. For example, when the memory cell, connected to the second control block CB2 of the memory deck, is selected, the far cell region or the near cell region of the memory deck may be reset by the second region set code D_C2.

The first pattern combiner 260a may include a first code register 261 configured to temporarily store the first correction code CC1 <4:0>. The second pattern combiner 260b may include a second code register 262 configured to temporarily store the second correction code CC2 <4:0>.

The first pattern combiner 260a and the second pattern combiner 260b may logically combine the first and second correction codes CC1 <4:0> and CC2 <4:0> in the code registers 261 and 262 and the first to fifth pattern generation signals IEQ1~IEQ5 to generate the first and second region set codes D_C1 and D_C2 to reset the various far cell regions.

In different embodiments, the first pattern combiner 260a and the second pattern combiner 260b may have substantially the same configuration. Thus, in order to avoid repeating the components of the first and second combiners 260a and 260b, only the first pattern combiner 260a is illustrated.

Figure 19:
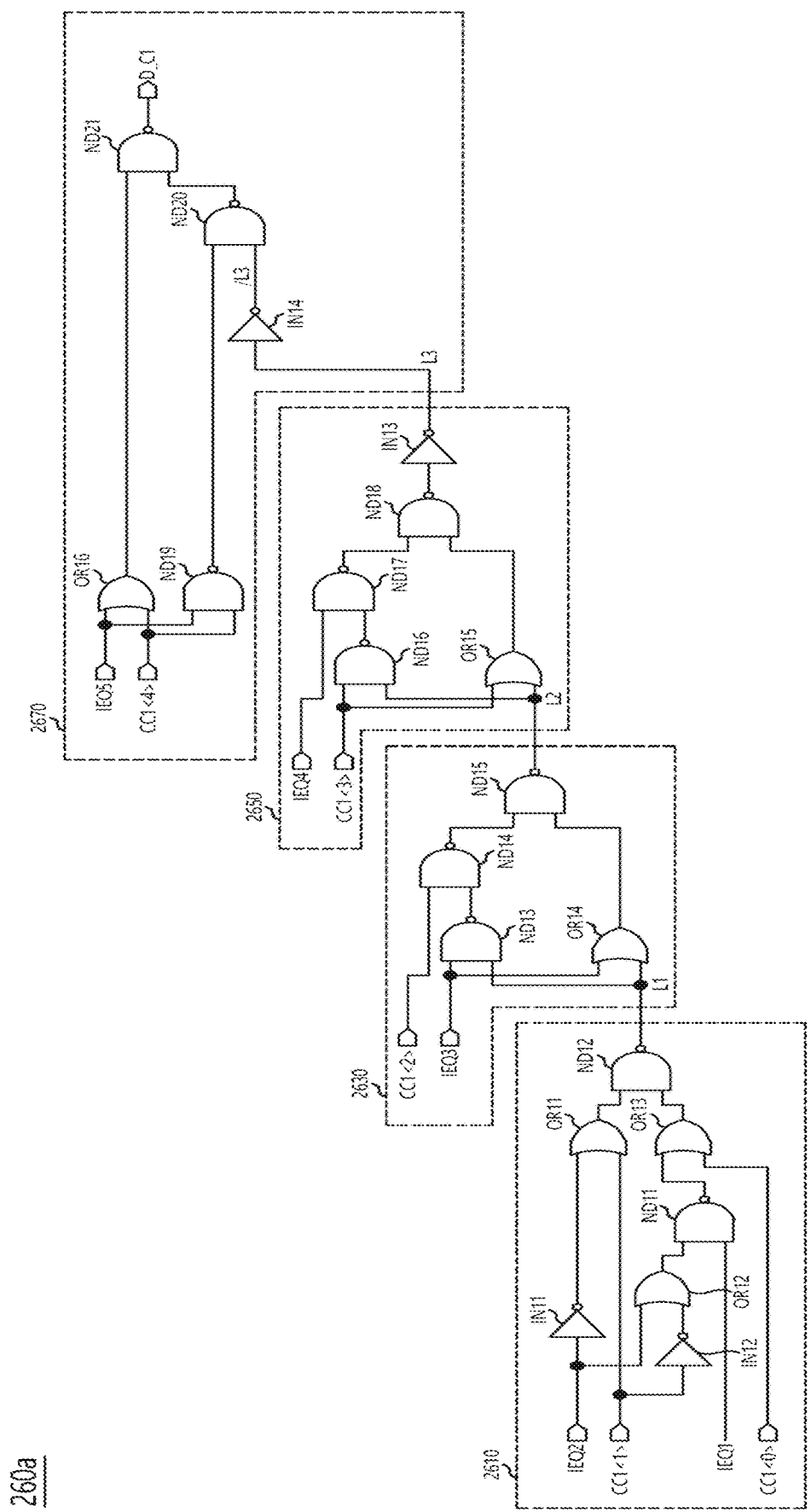
FIG. 19 is a circuit diagram, illustrating a first pattern combiner, in accordance with example embodiments.

FIG. 19 is a circuit diagram, illustrating a first pattern combiner, in accordance with example embodiments.

Referring to FIG. 19, the first pattern combiner 260a may include a 1-2 bits combiner 2610, a three bits combiner 2630, a four bits combiner 2650, and a five bits combiner 2670.

The 1-2 bits combiner 2610 may receive and combine a first bit CC1 <0> and a second bit CC1 <1> of the first correction code CC1 <4:0>, the first pattern generation signal IEQ1 and the second pattern generation signal IEQ2 with each other to generate a 1-2 bits set code L1. The 1-2 bits set code L1 may determine a first bit and a second bit of the first region set code D_C1.

The 1-2s bit combiner 2610 may be configured to perform inversion operations, OR operations, and NAND operations. The 1-2s bit combiner 2610 may include first and second inverters IN11 and IN12, first to third OR gates OR11, OR12 and OR13, and first and second NAND gates ND11 and ND12.

The first OR gate OR11 may receive the second pattern generation signal IEQ2, inverted by the first inverter IN11, and the second bit CC1 <1> of the first correction code CC1 <4:0>. The second OR gate OR12 may receive the second pattern generation signal IEQ2 and the second bit CC1 <1> of the first correction code CC1 <4:0> inverted by the second inverter IN12. The first NAND gate ND11 may receive an output signal from the second OR gate OR12 and the first pattern generation signal IEQ1. The third OR gate OR13 may receive an output signal from the first NAND gate ND11 and the first bit CC1 <0> of the first correction code CC1 <4:0>. The second NAND gate ND12 may receive an output signal from the first OR gate OR11 and an output signal from the third OR gate OR13 to generate the 1-2 bits set code L1.

The 3 bits combiner 2630 may receive the 1-2 bits set code L1, a third bit CC1 <2> of the first correction code CC1 <4:0>, the first pattern generation signal IEQ1 and the third pattern generation signal IEQ3 to generate a three bits set code L2.

The 3 bits combiner 2630 may be configured to perform an OR operation and NAND operations. The 3 bits combiner 2630 may include an OR gate OR14, and first to third NAND gates ND13, ND14 and ND15. The OR gate OR14 and the first NAND gate ND13 may receive the 1-2 bits set code L1 and the third pattern generation signal IEQ3. The second NAND gate ND14 may receive an output signal from the first NAND gate ND13 and the third bit CC1 <2> of the first correction code CC1 <4:0>. The third NAND gate ND15 may receive an output signal from the OR gate OR14 and an output signal from the second NAND gate ND14 to generate the three bit set code L2.

The 4 bit combiner 2650 may receive the three bit set code L2, a fourth bit CC1 <3> of the first correction code CC1 <4:0>, and the fourth pattern generation signal IEQ4 to generate a four bits set code L3.

The 4 bits combiner 2650 may be configured to perform an OR operation, NAND operations, and an inversion operation. The 4 bits combiner 2650 may include an OR gate OR15, first to third NAND gates ND16, ND17 and ND18, and an inverter IN13. The OR gate OR15 and the first NAND gate ND16 may receive the 3 bits set code L2 and the fourth pattern generation signal IEQ4. The second NAND gate ND17 may receive an output signal from the first NAND gate ND16 and the fourth bit CC1 <3> of the first correction code CC1 <4:0>. The third NAND gate ND18 may receive an output signal from the OR gate OR15 and an output signal from the second NAND gate ND17. The inverter In13 may invert the third NAND gate ND18 to generate the four bits set code L3.

The 5 bits combiner 2670 may receive the four bits set code L3, a fifth bit CC1 <4> of the first correction code CC1 <4:0>, and the fifth pattern generation signal IEQ5 to generate the first region set code D_C1.

The 5 bits combiner 2670 may be configured to perform OR operations, NAND operations, and an inversion operation. The 5 bits combiner 2670 may include an OR gate OR16, first to third NAND gates ND19, ND20 and ND21, and an inverter IN14. The OR gate OR16 and the first NAND gate ND19 may receive the 4 bits set code L3 and the fifth pattern generation signal IEQ5. The second NAND gate ND20 may receive an inverted four bits set code /L3 which is an output signal of the inverter IN14 and an output signal from the first NAND gate ND19. The third NAND gate ND21 may receive an output signal from the OR gate OR16 and an output signal from the second NAND gate ND20 to generate the first region set code D_C1.

As a result, the first pattern combiner 260a may generate the first region set code D_C1 to change the boundary of the far cell region in the first correction code CC1 <4:0>. For example, the first pattern combiner 260a may add or subtract the far cell region, defined by the first correction code CC1 <4:0>, to or from the pattern region of the memory cell, selected by at least one among the first to fifth pattern generation signals IEQ1~IEQ5 to generate the first region set code D_C1 to change the boundary of the far cell region of the memory deck.

Similarly, the second pattern combiner 260b may generate the second region set code D_C2 to change the boundary of the far cell region in the second correction code CC2 <4:0>. For example, the second pattern combiner 260b may add or subtract the far cell region, defined by the second correction code CC2 <4:0>, to or from the pattern region of the memory cell, selected by at least one among the first to fifth pattern generation signals IEQ1~IEQ5 to generate the second region set code D_C2 to change the boundary of the far cell region of the memory deck.

FIGS. 20 to 23 are graphs, showing distributions of selected memory cells, in accordance with a region set code in accordance with example embodiments.

Figure 20:
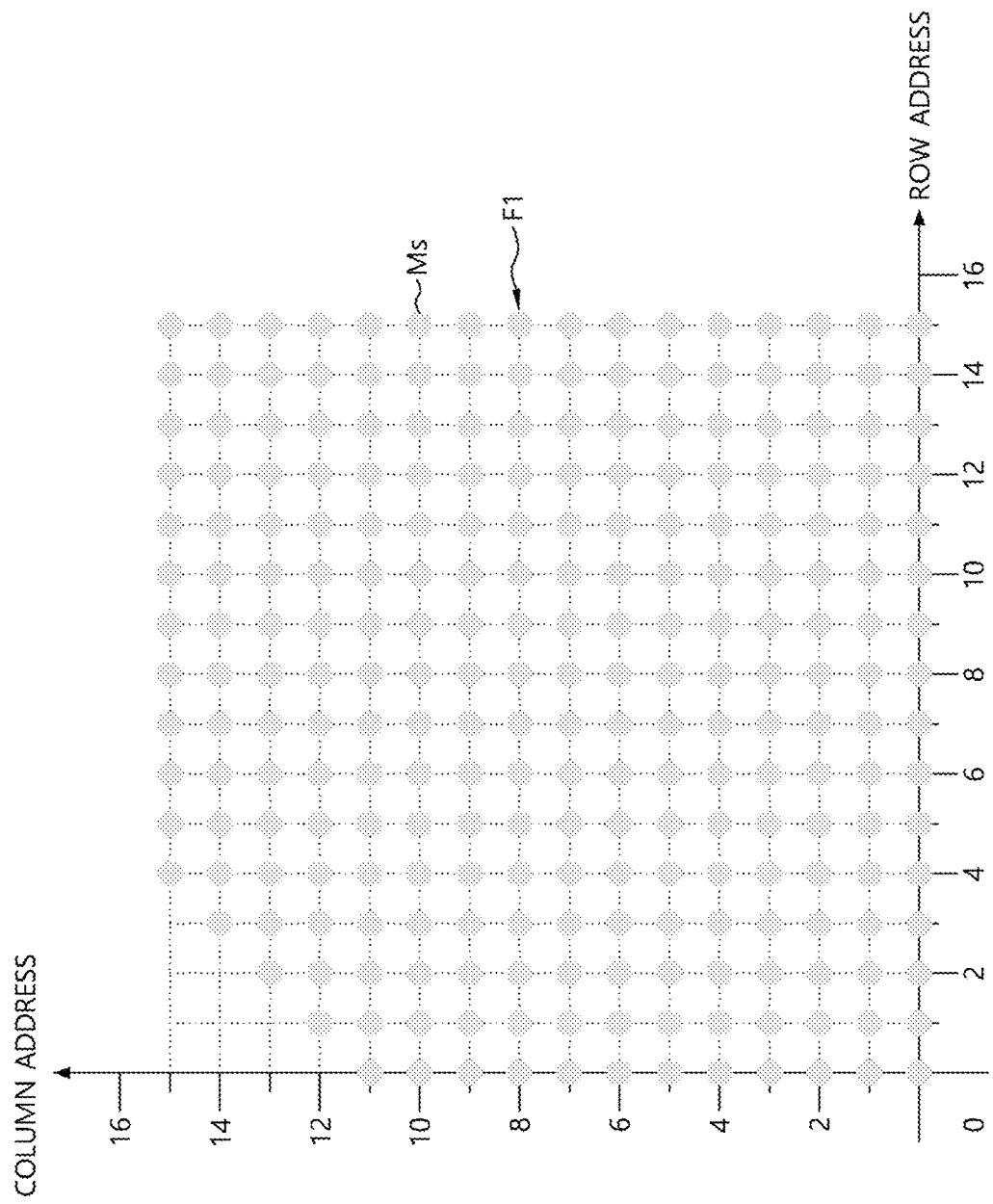
FIGS. 20 to 23 are graphs, showing distributions of selected memory cells, in accordance with a region set code, in accordance with example embodiments.

FIG. 20 may show a distribution of memory cells Ms, selected by the first region set code D_C1 or the second region set code D_C2, when the first correction code CC1 <4:0> is "00011". For example, when "00011," as the first correction code CC1 <4:0>, is inputted into the first pattern combiner 260a, the first pattern combiner 260a may select memory cells MC (n, n~n+11), n=an integer between 0~3, among the 16×16 memory cells MC (0~15, 0~15). The selected memory cells Ms may form a first far cell region F1. The first far cell region F1 may be defined by a combination of an initial far cell region in the temporary codes TC1 and TC2 and a far cell region in the correction codes CC1 <4:0> and CC2 <4:0>.

Figure 21:
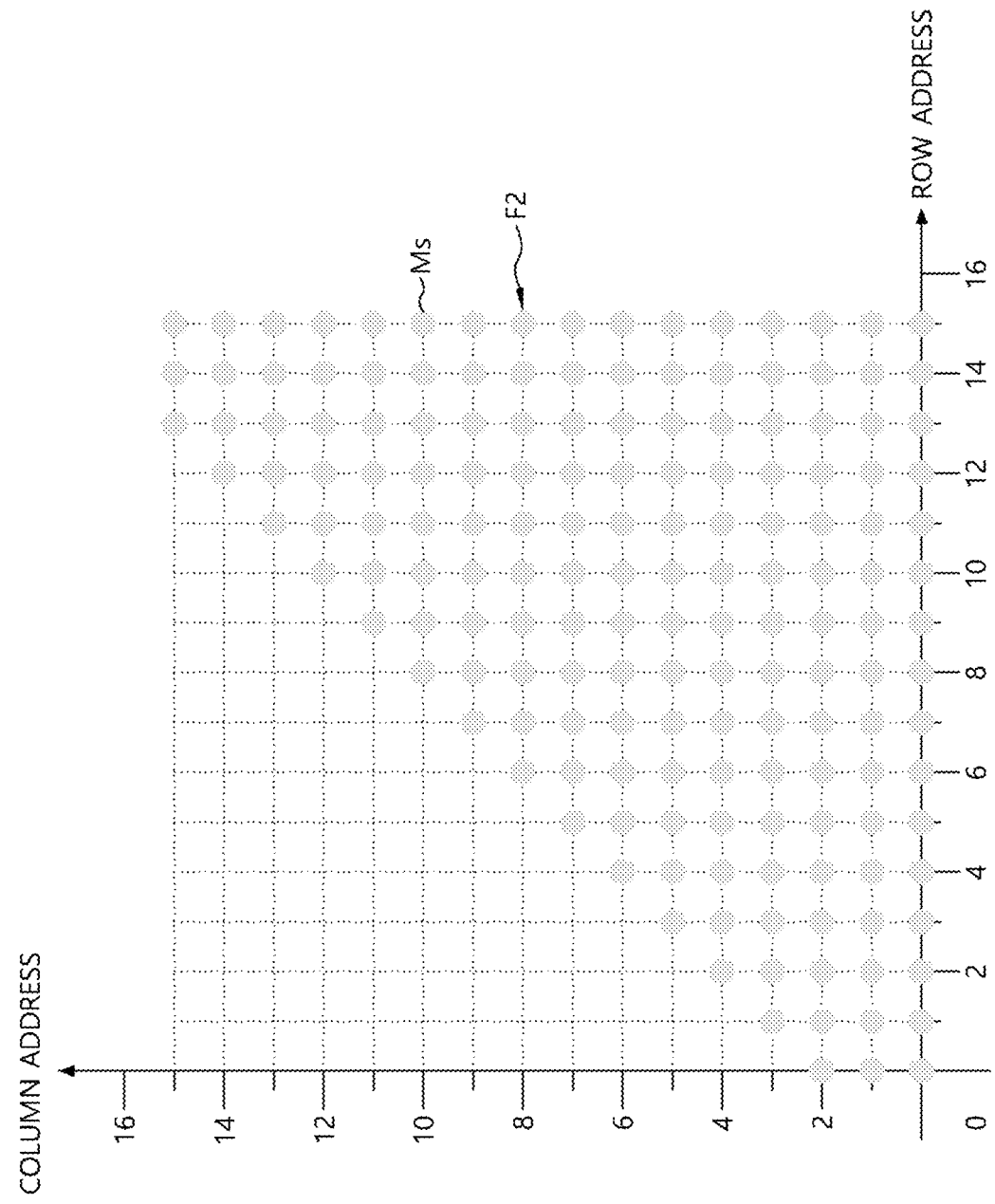

FIG. 21 may show a distribution of memory cells Ms, selected by the first region set code D_C1 or the second region set code D_C2, when "01100," as the first correction code CC1 <4:0> or the second correction code CC2 <4:0>, is inputted. For example, when "01100," as the first correction code CC1 <4:0>, is inputted into the first pattern combiner 260a, the first pattern combiner 260a may select memory cells MC (n, 0~n+2), n=an integer between 0~15, among the 16×16 memory cells MC (0~15, 0~15) to form a second far cell region F2. The second far cell region F2 may have an area smaller than that of the first far cell region F1.

Figure 22:
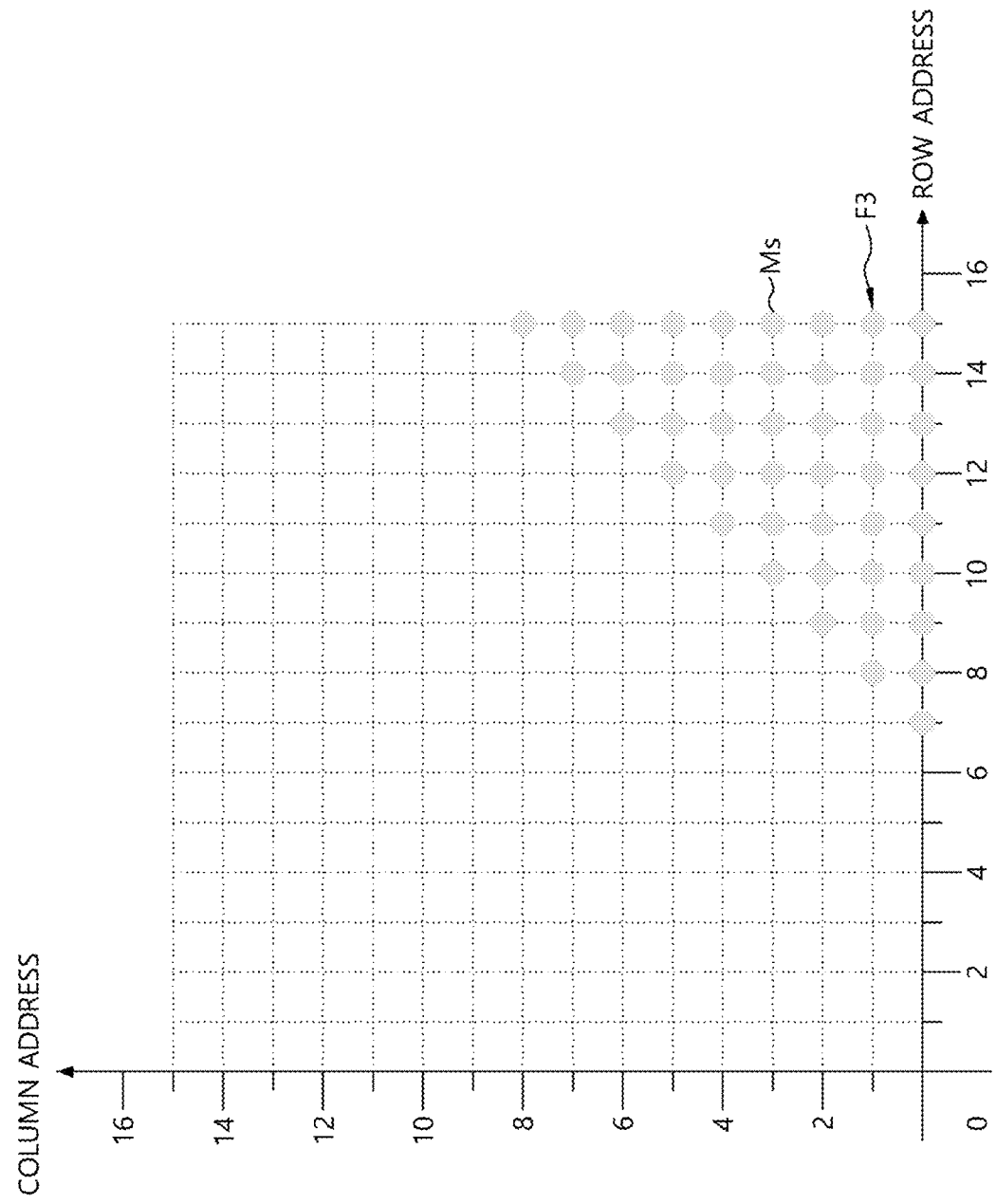

FIG. 22 may show a distribution of memory cells Ms, selected by the first region set code D_C1 or the second region set code D_C2, when the first correction code CC1 <4:0> or the second correction code CC2 <4:0> is "10101". For example, when "10101," as the first correction code CC1 <4:0>, is inputted into the first pattern combiner 260a, the first pattern combiner 260a may select memory cells MC (n+7~15, n~8), n=an integer between 0~8, among the 16×16 memory cells MC (0~15, 0~15) to form a third far cell region F3. The third far cell region F3 may have an area smaller than those of the first and second far cell regions F1 and F2.

Figure 23:
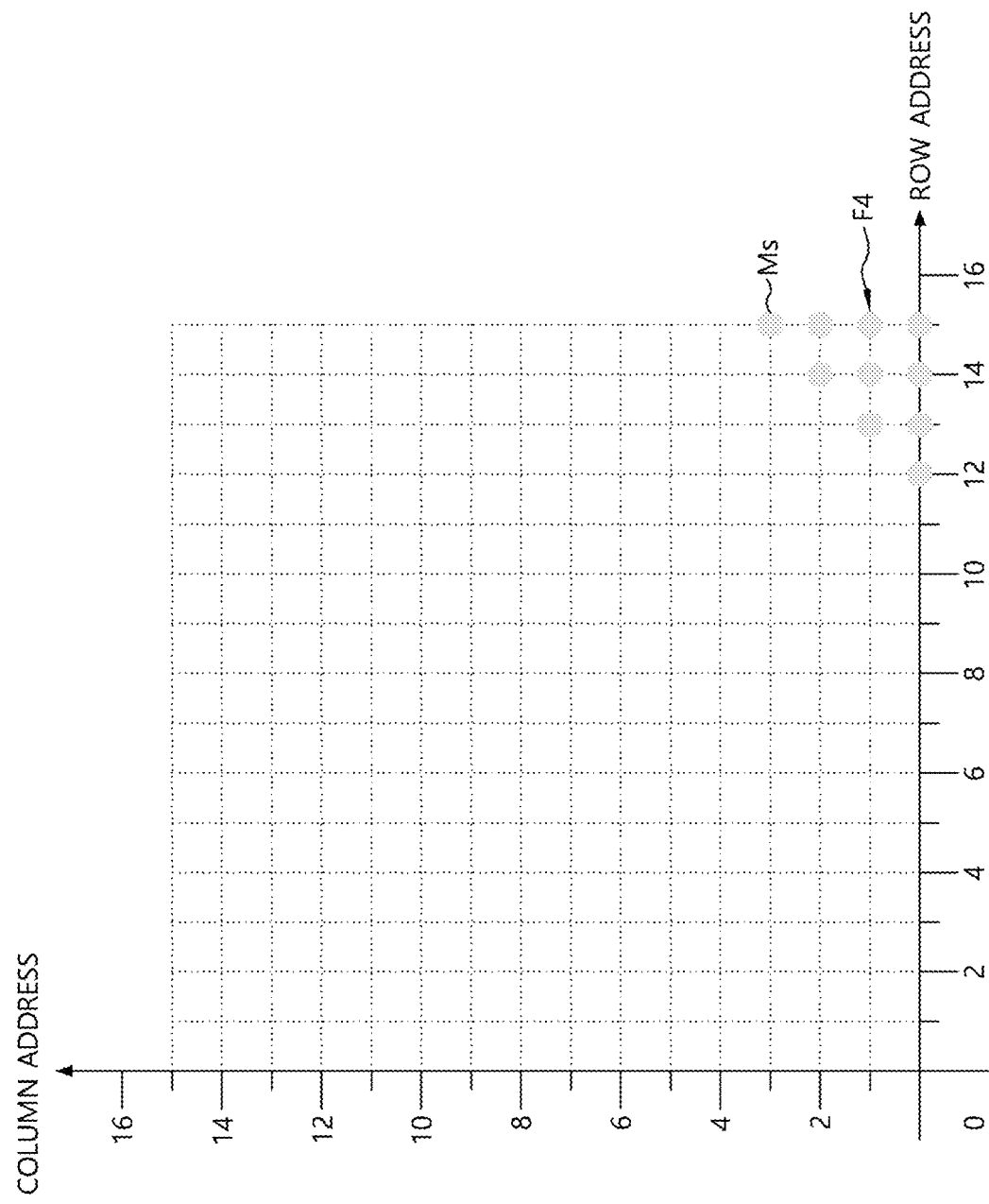

FIG. 23 may show a distribution of memory cells Ms, selected by the first region set code D_C1 or the second region set code D_C2, when the first correction code CC1 <4:0> or the second correction code CC2 <4:0> is "11010". For example, when "11010," as the first correction code CC1 <4:0>, is inputted into the first pattern combiner 260a, the first pattern combiner 260a may select memory cells MC (n+12~15, n), n=an integer between 0~3, among the 16×16 memory cells MC (0~15, 0~15) to form a fourth far cell region F4. The fourth far cell region F4 may have an area smaller than those of the first to third far cell regions F1, F2 and F3.

The "00011" code, the "01100" code, the "10101" code, and the "11010" code, as the first or second correction code CC1 <4:0> or CC2 <4:0>, may be used to set the first to fourth far cell regions F1, F2, F3, and F4, thereby obtaining various pattern combinations, because 1 and 2 bits, 1 to 3 bits and/or 1 to 4 bits of each of the 00011 code, the 01100 code, the 10101 code and the 11010 code may be different.

Figure 24:
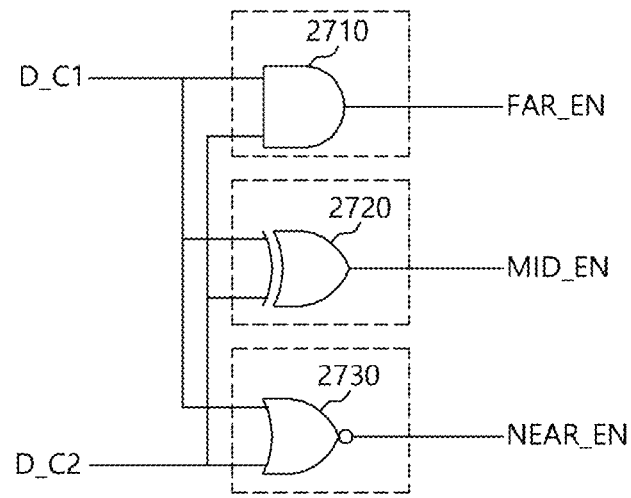
FIG. 24 is a circuit diagram, illustrating a signal combiner, in accordance with example embodiments.
Figure 25:
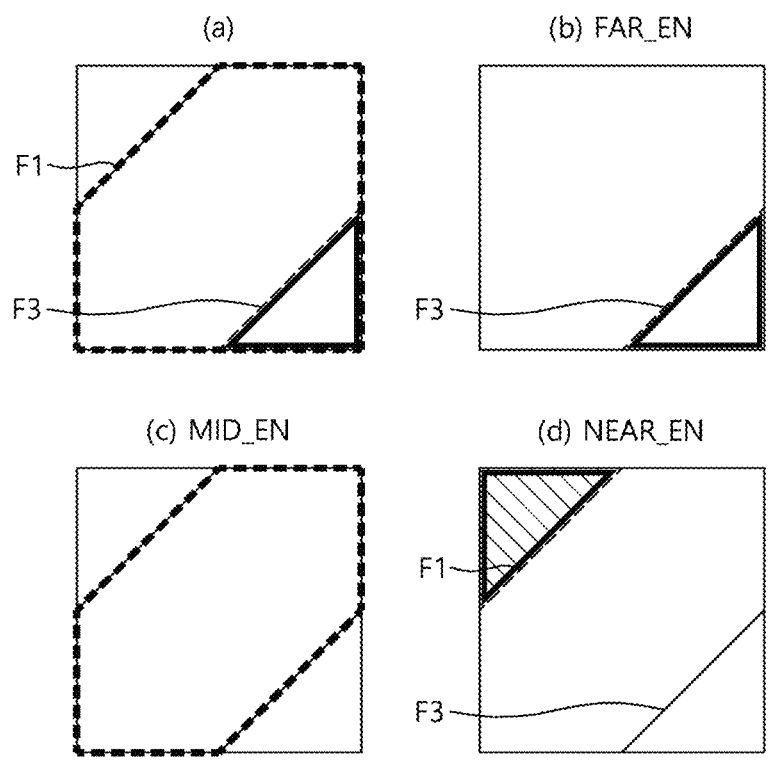
FIG. 25 is a view, illustrating a method of setting regions of a deck, in accordance with example embodiments.

FIG. 24 is a circuit diagram, illustrating a signal combiner, in accordance with example embodiments, and FIG. 25 is a view, illustrating a method of setting regions of a deck, in accordance with example embodiments.

Referring to FIG. 24, the signal combiner 270 may include a far cell region setter 2710, a middle cell region setter 2720, and a near cell region setter 2730.

The far cell region setter 2710 may receive the first region set code D_C1 and the second region set code D_C2. The far cell region setter 2710 may generate a first reset signal FAR_EN to set a common part, between a region set, by the first region set code D_C1 and a region set by the second region set code D_C2 as the far cell region. The far cell region setter 2710 may include a logic circuit configured to perform an AND operation of the first region set code D_C1 and the second region set code D_C2. For example, as shown in FIG. 25, when the first far cell region F1 is defined by the first region set code D_C1 and the third far cell region F3 is defined by the second region set code D_C2 [See (a)], a reset far cell region (b) FAR_END may be the third far cell region F3 corresponding to a common part between the first far cell region F1 and the third far cell region F3.

The middle cell region setter 2720 may receive the first region set code D_C1 and the second region set code D_C2. The middle cell region setter 2720 may generate a second reset signal MID_EN to set a middle set region formed by subtracting the far cell region from a combined region between a region set by the first region set code D_C1 and a region set by the second region set code D_C2. The middle cell region setter 2720 may include a logic circuit configured to perform an exclusive OR operation of the first region set code D_C1 and the second region set code D_C2. Thus, as shown in FIG. 25, the middle cell region (c) MID_EN may be defined by subtracting the reset far cell region (b) from the first far cell region F1.

The near cell region setter 2730 may receive the first region set code D_C1 and the second region set code D_C2. The near cell region setter 2730 may generate a third reset signal NEAR_EN to set a region not corresponding to a region set by the first region set code D_C1 and a region set by the second region set code D_C2 as the near cell region. The near cell region setter 2730 may include a logic circuit configured to perform a NOR calculation of the first region set code D_C1 and the second region set code D_C2. Thus, as shown in FIG. 25, the near cell region (d) NEAR_EN may be defined as the region not included in the first far cell region F1 and the third far cell region F3.

Figure 26:
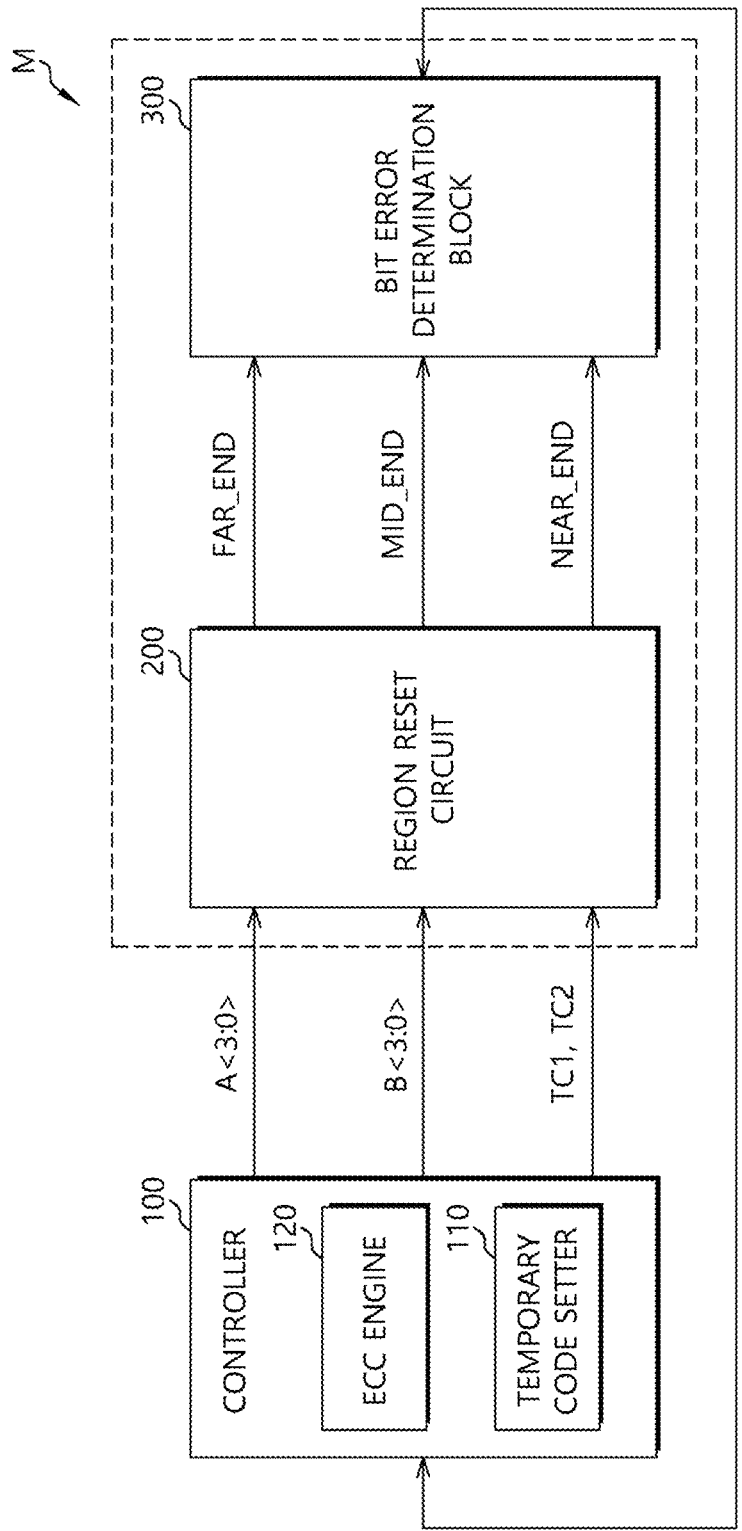
FIG. 26 is a block diagram, illustrating a semiconductor memory system including a bit error determination block, in accordance with example embodiments.

FIG. 26 is a block diagram, illustrating a semiconductor memory system including a bit error determination block, in accordance with example embodiments.

Referring to FIG. 26, the first to third reset signals FAR_EN, MID_EN, and NEAR_EN, generated from the region reset circuit 200, may be transmitted to the bit error determination block 300 in the semiconductor memory device M.

As mentioned above, the region reset circuit 200 may reset the positions of the face cell region, the middle cell region, and the near cell region, temporarily set by the controller 100, based on the positions of the memory decks, the connection relations between the control circuit blocks CB1 and CB2 and the memory cells, etc. Therefore, the bit error determination block 300 may detect bit error ratios of regions classified in accordance with the first to third reset signals FAR_EN, MID_EN, and NEAR_EN in response to the first to third reset signals FAR_EN, MID_EN, and NEAR_EN to reset the boundaries between the far cell region, the middle cell region and the near cell region.

The bit error ratios, measured by the bit error determination block 300 of the semiconductor memory device M, may be transmitted to the temporary code setter 110. The temporary code setter 110 may change the boundary between the temporary far cell region and the temporary near cell region of the memory deck based on the measured bit error ratio. The temporary code setter 110 may then transmit changed boundary codes A<3:0> and B<3:0> to the memory device M to compensate for the bit error.

The temporary code setter 110 in the controller 100 may change the address information of the far cell region and the near cell region in the temporary codes TC1 <4:0> and TC2 <4:0> (i.e., the boundary address of the far cell region based on the bit error ratio).

Figure 27:
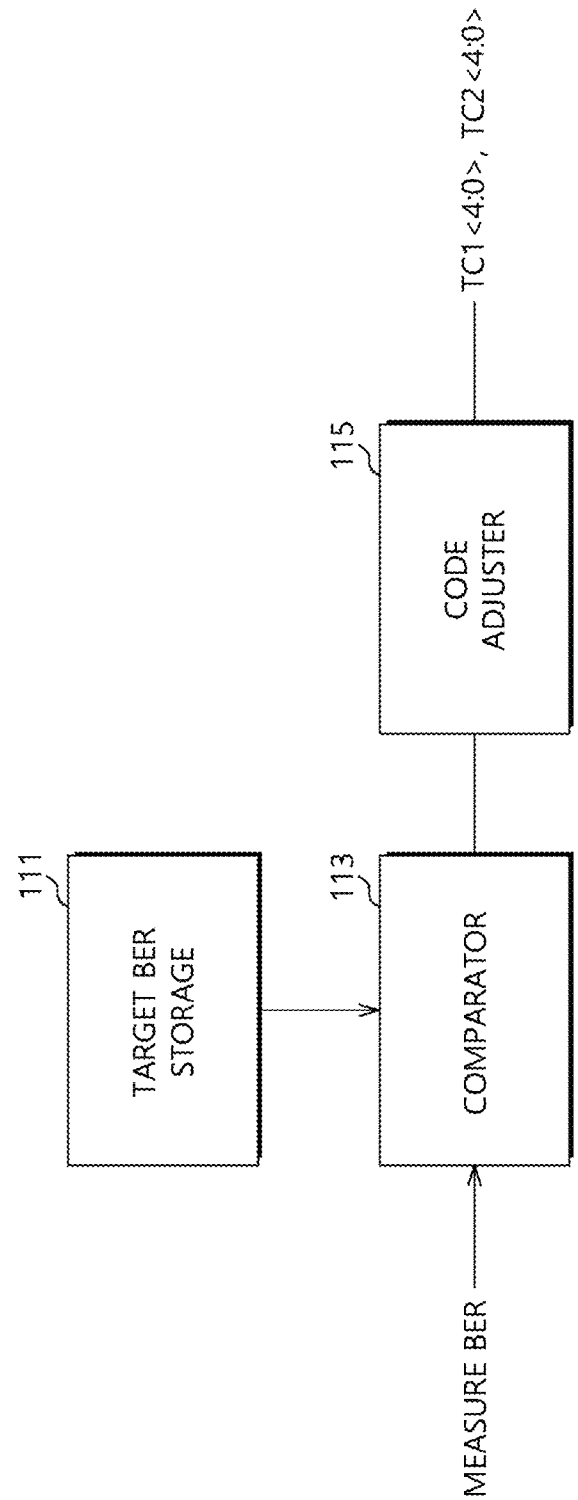
FIG. 27 is a block diagram, illustrating a temporary code setter, in accordance with example embodiments.
Figure 28:
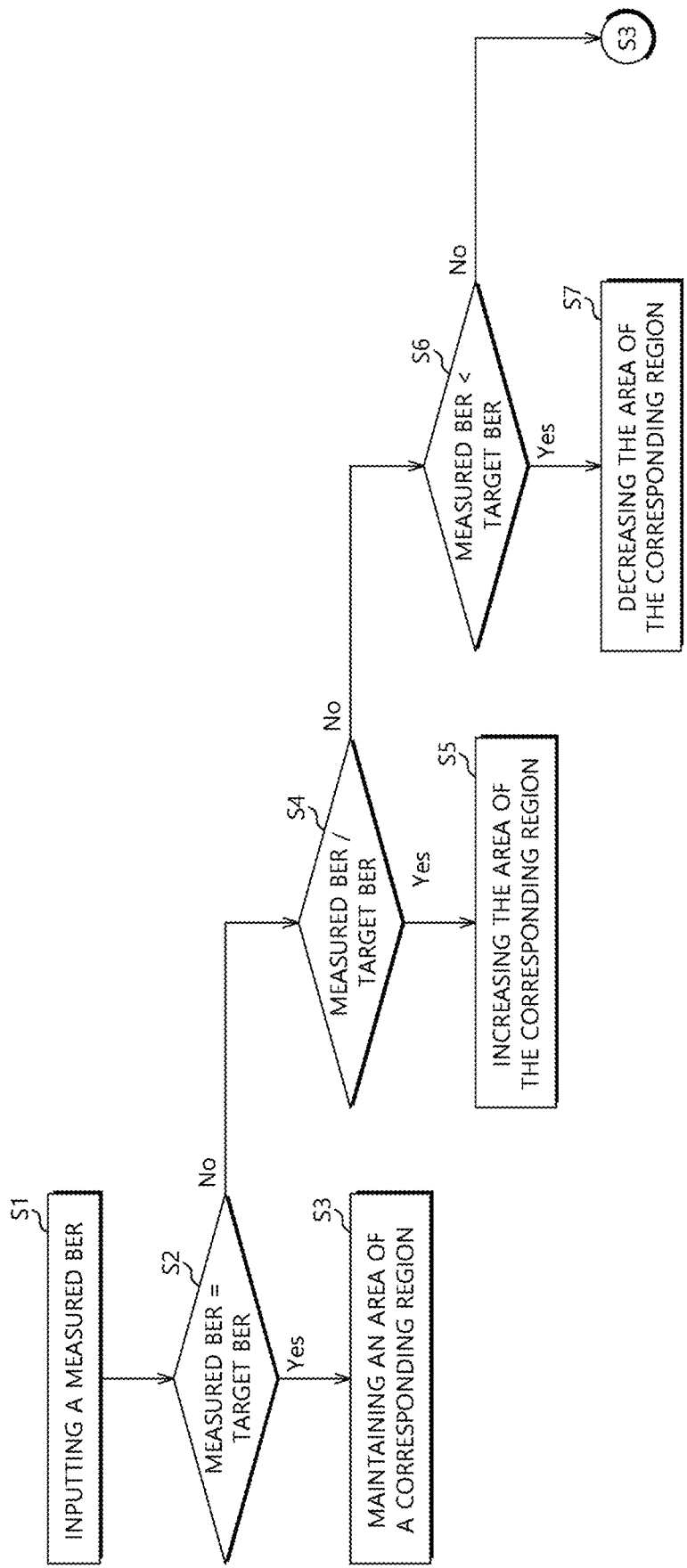
FIG. 28 is a flow chart, illustrating operations of a temporary code setter, in accordance with example embodiments.

FIG. 27 is a block diagram, illustrating a temporary code setter, in accordance with example embodiments, and FIG. 28 is a flow chart, illustrating operations of a temporary code setter, in accordance with example embodiments.

Referring to FIG. 27, the temporary code setter 110 may include a target bit error ratio (BER) storage 111, a comparator 113, and a code adjuster 115.

The target BER storage 111 may store target bit error ratios of the far cell region, the middle cell region, and the near cell region. The target BER may refer to a maximum error ratio that is determined to be abnormal (or error). The target BER storage 111 may include a register.

The comparator 113 may compare a BER of a corresponding region, measured by the bit error determination block 300 (as shown in FIG. 26) of the semiconductor memory device M, with the target BER provided from the target bit error ratio storage 111. The comparator 113 may then transmit comparison results to the code adjuster 115.

The code adjuster 115 may change the boundaries between the near cell region, the middle cell region, and/or the far cell region of the temporary codes TC1 <4:0> and TC2 <4:0> based on the comparison results.

Hereinafter, operations of the temporary code setter of example embodiments will be described with reference to FIG. 28.

Referring to FIG. 28, in step S1, a BER of a corresponding region, measured by the bit error determination block 300 of the semiconductor memory device M, may be inputted into the temporary code setter 110.

In step S2, the comparator 113 of the temporary code setter 10 may compare the measured BER with the target BER of the corresponding region. In step S3, when the measured BER is substantially the same as the target BER of the corresponding region, a boundary of the corresponding region may be maintained.

In step S4, when the measured BER is higher than the target BER of the corresponding region, the area of the corresponding region may be reduced to decrease the BER of the corresponding region in step S5. That is, the code adjuster 115 may change address bits of the temporary codes TC1 <4:0> and TC2 <4:0> based on comparison results inputted from the comparator 113 to change the boundary of the corresponding region of the temporary codes TC1 <4:0> and TC2 <4:0>.

In contrast, in step S6, when the measured BER is lower than an allowable range measured from the target BER of the corresponding region, the area of the corresponding region may be set to be very large to decrease the BER of the corresponding region in step S7. That is, the code adjuster 115 may change address bits of the temporary codes TC1 <4:0> and TC2 <4:0> to decrease the area of the corresponding region.

When the measured BER is within the allowable range, the area of the corresponding region may be maintained in step S3.

According to example embodiments, each of the regions of the stack type resistive change memory device may be reset based on actual positions of the memory cells and the bit error ratios to prevent a yield of the semiconductor memory device from being decreased caused by an error concentration on a specific region.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A semiconductor memory device including a control circuit block and a plurality of memory decks electrically connected with the control circuit block, the semiconductor memory device comprising:
   a pattern generation block configured to receive a row address, a column address and a deck selection signal to generate a plurality of pattern generation signals to select a plurality of memory cells in a selected memory deck in various patterns;
   a position correction block configured to receive a temporary code for classifying each of the memory cells into a temporary near cell region and a temporary far cell region and to reflect a position of the memory deck in the temporary code to output a correction code; and
   a position determination block configured to generate first to third reset signals to reset a near cell region, a middle cell region and a far cell region based on the pattern generation signals and the correction code.

2. The semiconductor memory device of claim 1, wherein the pattern generation block is configured to generate the pattern generation signals to select the memory cells of the selected memory deck by one bit, two bits, four bits, eight bits and sixteen bits based on the row address, the column address, and the deck selection signal.

3. The semiconductor memory device of claim 1, wherein the pattern generation block comprises:
   a first pattern generator configured to combine a first bit of the row address with a first bit of the column address to output a first carry signal and a first pattern generation signal for selecting memory cell by one bit;

a second pattern generator configured to output at least one of a second carry signal and a second pattern generation signal for selecting memory cell by two bits in response to a pair of first control signals generated by combining a second bit of the row address with a second bit of the column address, wherein the second pattern generation signal and the second carry signal includes the first carry signal or the second bit signal of the column address;

a third pattern generator configured to output at least one of a third carry signal and a third pattern generation signal for selecting memory cell by four bits in response to a pair of second control signals generated by combining a third bit of the row address with a third bit of the column address, wherein the third pattern generation signal and the second carry signal includes the second carry signal or the third bit signal of the column address; and a fourth pattern generator configured to output a fourth carry signal and a fourth pattern generation signal for selecting memory cell by eight bits or selecting memory cell by sixteen bits in response to a pair of third control signals generated by combining a fourth bit of the row address with a fourth bit of the column address.

4. The semiconductor memory device of claim 1, wherein the position correction block comprises:

at least one register configured to store a position code of the memory deck, and to output the position code of the memory deck selected in response to the deck selection signal; and an adder configured to add the temporary code to the position code of the selected memory deck outputted from the register, and to output the correction code.

5. The semiconductor memory device of claim 1, wherein the deck selection signal comprises a plurality of address bits changed in accordance with a stacked position, and the position correction block comprises an adder configured to add an address bit of the deck selection signal with an address bit of the temporary code.

6. The semiconductor memory device of claim 3, wherein the temporary code comprises a first temporary code and a second temporary code, wherein the position determination block comprises:
a first pattern combiner configured to generate a first region set code based on a first correction code, generated based on the first temporary code, and the pattern generation signals;
a second pattern combiner configured to generate a second region set code based on a second correction code, generated based on the second temporary code, and the pattern generation signals; and
a signal combiner configured to generate the first to third reset signals based on the first region set code and the second region set code,
wherein the first temporary code defines a boundary of the far cell region when memory cell connected to the control circuit blocks at a first area of the memory deck is selected, and
wherein the second temporary code defines the boundary of the far cell region when memory cell connected to the control circuit blocks at a second area of the memory deck is selected, wherein the second area of the memory deck is opposite to the first area of the memory deck.

7. The semiconductor memory device of claim 6, wherein each of the first and second pattern combiners is configured to add or subtract the far cell region, set by the first correction code or the second correction code, to and from regions of the selected memory cells set by the first to fifth pattern generation signals to generate the first region set code or the second region set code.

8. The semiconductor memory device of claim 6, wherein each of the first and second pattern combiners comprises:
a 1-2 bits combiner configured to combine the first pattern generation signal, the second pattern generation signal, a first bit of the first or second correction code and a second bit of the first or second correction code with each other to generate a 1-2 bits set code;
a 3 bit combiner configured to combine a third bit of the first or second correction code with the third pattern generation signal to generate a 3 bits set code;
a 4 bit combiner configured to combine a fourth bit of the first or second correction code with the fourth pattern generation signal to generate a 4 bits set code; and
a 5 bit combiner configured to combine a fifth bit of the first or second correction code with the fifth pattern generation signal to generate a 5 bits set code.

9. The semiconductor memory device of claim 6, wherein the signal combiner is configured to output a first reset signal to reset a common part between a part defined by the first region set code and a part defined by the second region set code as the far cell region, wherein the signal combiner is configured to output a second reset signal to reset a non-common part between the part defined by the first region set code and the part defined by the second region set code as the middle cell region, and wherein the signal combiner is configured to output a third reset signal to reset a part excluding the part defined by the first region set code and the part defined by the second region set code as the near cell region.

10. A method of driving a semiconductor memory device including a pattern generation block configured to receive a row address, a column address, and a deck selection signal for selecting one of a plurality of stacked memory decks to generate a plurality of pattern generation signals to select a plurality of memory cells in a selected memory deck in various patterns; a position correction block configured to receive a temporary code for classifying each of the memory cells into a temporary near cell region and a temporary far cell region and to reflect a position of the selected memory deck in the temporary code to output a correction code; and a position determination block configured to generate first to third reset signals to reset a near cell region, a middle cell region and a far cell region based on the pattern generation signals and the correction code, the method comprising:

measuring bit error ratios of the far cell region, the middle cell region, and the near cell region in the selected memory deck;

comparing a bit error ratio of a selected region among the far cell region, the middle cell region, and the near cell region, to a target bit error ratio of the selected region; and changing an area of the selected region when the measured bit error ratio of the selected region is higher than the target bit error ratio of the selected region.

11. The method of claim 10, wherein the area of the selected region is changed by changing the temporary code.

12. The method of claim 11, wherein the temporary code is changed to increase the area of the selected region when the measured bit error ratio of the selected region is higher than the target bit error ratio of the selected region.

13. The method of claim 10, wherein the temporary code comprises address information to define a boundary of the far cell region of the selected memory deck.

14. The method of claim 10, further comprising:
generating the correction code based on the temporary code and the position of the selected memory deck; and
resetting the areas of the near cell region, the middle cell region and the far cell region based on the correction code.

* * * * *